United States Patent [19]

Boisvert et al.

[11] Patent Number: 5,189,277

[45] Date of Patent: Feb. 23, 1993

[54] MODULAR, STACKABLE PLASMA CUTTING APPARATUS

[75] Inventors: John A. Boisvert; Fred A. Rogers, both of Grafton; Dennis J. Solley, Merrimack; David A. Tatham; Raymond G. Wilkins, both of Grafton, all of N.H.

[73] Assignee: Thermal Dynamics Corporation, St. Louis, Mo.

[21] Appl. No.: 682,727

[22] Filed: Apr. 8, 1991

[51] Int. Cl.$^5$ ............................ B23K 9/00; B23K 9/10
[52] U.S. Cl. .......................... 219/121.54; 219/121.48; 219/130.1
[58] Field of Search .................. 219/121.5, 121.48, 75, 219/130.1, 121.54, 121.57

[56] References Cited

U.S. PATENT DOCUMENTS 4,280,041 7/1981 Kiessling et al. ................. 219/130.1
4,985,612 1/1991 Izume et al. ..................... 219/130.1

FOREIGN PATENT DOCUMENTS 0053774 3/1989 Japan ............................. 219/121.54

OTHER PUBLICATIONS

Hypertherm, Inc.—Spec. Sheet #82 "Advance Product Information".
Hypertherm, Inc., Spec. Sheet #42 "Advance Product Information".
L-TEC Products—PCM-150—Plasmarc Welding & Cutting—7041-E 6M Nov. 1989.
Thermal Dynamics Corp.—PAK 5XR—Cat. No. 0-0588 (Aug. 1, 1989).
Thermal Dynamics Corp.—DYNAPAK 4XI—Cat. No. 0-0737 (Aug. 1989).
Thermal Dynamics Corp.—Thermal Arc 500—Cat. No. 0-0351 Sep. 9, '87.
Thermal Dynamics—PAK 10XR—Cat. No. 0-0741 (Mar. 15, 1989).
Thermal Dynamics—Merlin—PAK 15XC—Cat. No. 0-0752 Jan. 1990.
Thermal Dynamics—PAK 7XR—Cat. No. 0-0739 (Feb. 1, 1989).

*Primary Examiner*—Mark H. Paschall
*Attorney, Agent, or Firm*—Paul M. Denk

[57] ABSTRACT

Plasma cutting apparatus (10) for use in cutting a material (M). A torch (12) cuts the material. A control unit (14) controls the cutting operation performed by the torch and includes a control module (16) in which the control unit is housed. At least one power unit (18) supplies power to the cutting torch, the application of this power being controlled by the control unit. Each power unit includes a power module (24) in which the power unit is housed. A cooling unit (54) for cooling the torch is also available. The cooling unit includes a cooling module (56). The control module, power module(s), and coolant module are removably stackable one on top of the other.

25 Claims, 15 Drawing Sheets

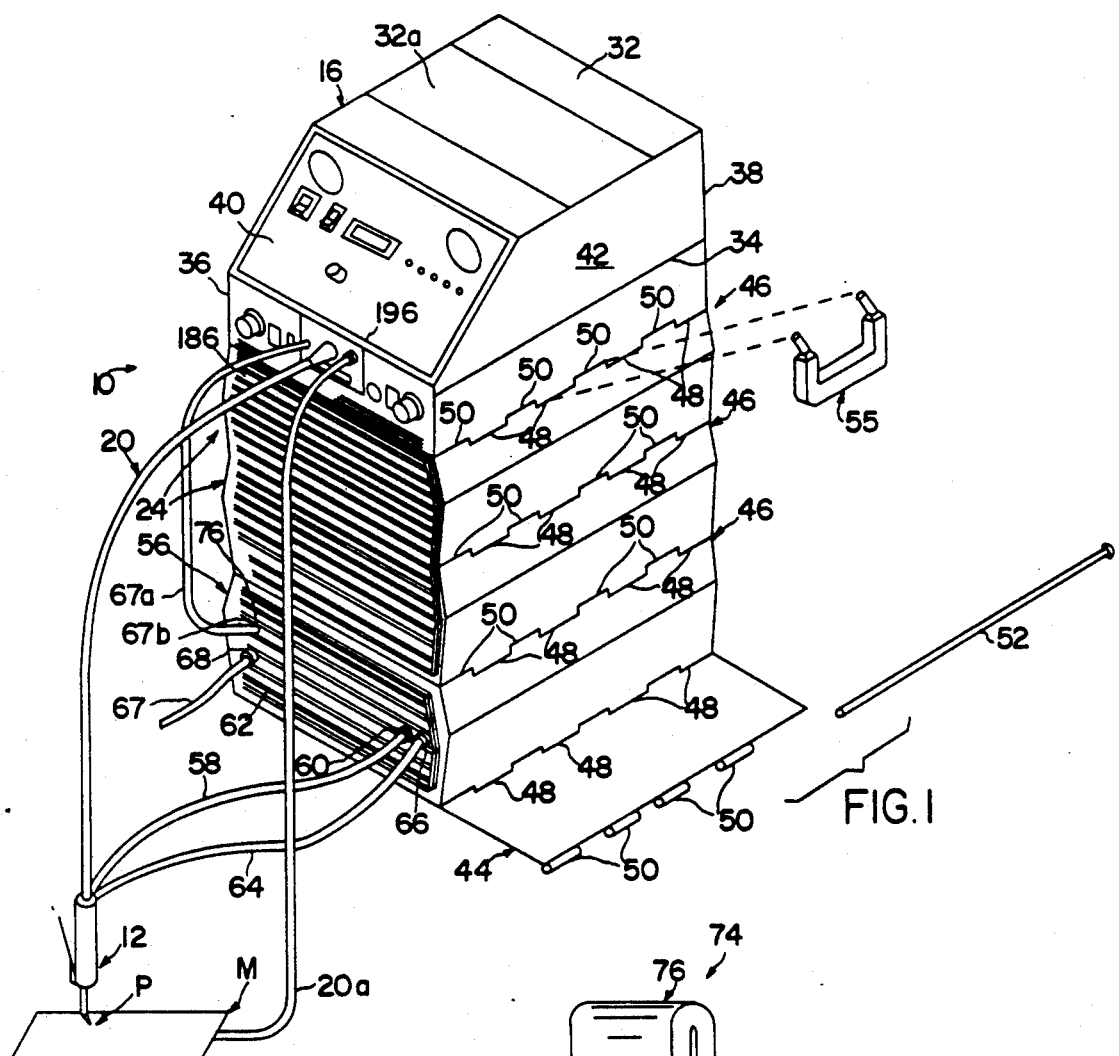
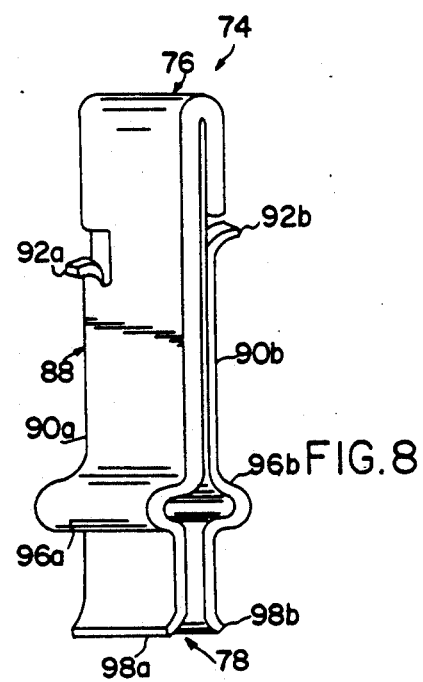

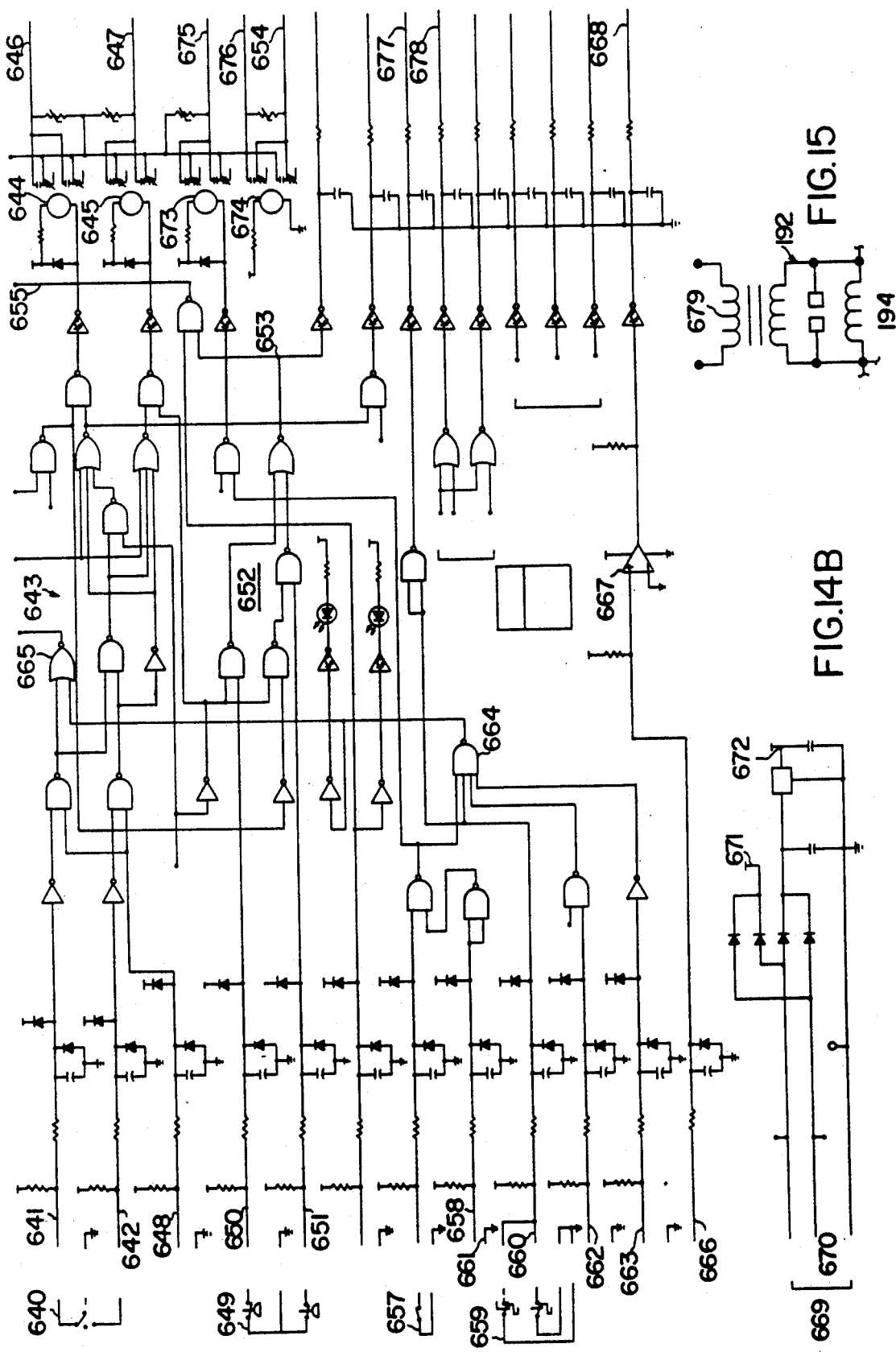

MODULAR, STACKABLE PLASMA CUTTING APPARATUS

BACKGROUND OF THE INVENTION

This invention relates to apparatus for cutting material such as steel or the like using a plasma and, more particularly, to apparatus which is modularized to permit a wide flexibity in configuring the power supply, control and cooling equipment used in a plasma cutting operating. The modules comprising the apparatus are removably stackable to simplify changing from one configuration, for one cutting operation, to a new configuration for a different type cutting operation. The invention further includes novel electronics for achieving improvements in torch cutting and welding.

Plasma arc welding is well-known in the art and there are many and varied applications for use of plasma arc welding equipment. See, for example, U.S. Pat. Nos. 4,839,499, 4,590,357, 4,326,842, 4,280,042, and 3,988,566. It is not uncommon in a manufacturing operation for different welding equipment set-ups to be required. Thus, one set-up may require one type of cutting torch, necessitate use of a power supply capable of delivering a voltage and a current having one set of characteristics (i.e. single or multi-phase power, voltage and amperage levels, etc.), and a particular level of cooling. Another set-up may require a wholly different torch, power, and cooling configuration. Changing from one set-up to another has heretofore required a substantial amount of time to reconfigure torches, power supplies and cooling equipment. In manufacturing operations, this "down-time" adds to the overall cost of the product and reduces the volume of units produced. In the alternative, two or more sets of equipment can be utilized, this equipment being kept in a particular configuration for whatever operations have to be done. This, of course, increases equipment costs, work and storage space requirements, etc. And, even having a profusion of equipment does not insure that set-up changes will not have to be made. It would be advantageous if it were possible to have apparatus which was capable of performing a myriad of cutting operations but which was sufficiently flexible that the amount of equipment required is minimized, that reconfiguration time for changing set-ups is substantially reduced, and the equipment used will support many varied cutting operations.

SUMMARY OF THE INVENTION

It is an object of the present invention to provide plasma cutting apparatus which is usable in a wide variety of manufacturing operations that require differing set-ups for cutting metal. An inherent objective is to provide improvements in welding equipment.

A further object of the invention is to provide plasma cutting apparatus which is modularized so power, cooling, and control modules are available which can be arranged in different configurations for varied and different operations and which minimizes the amount of equipment required to support a wide variety of cutting operations. In particular, standard power modules are available which can be so configured and arranged that differing power requirements are readily accommodated. The power modules produce a DC power output and are connectable to either a single-phase or a multi-phase AC power source.

Another object of the invention is to provide modularized plasma cutting apparatus which is stackable to ease configuration changeovers, reduce the amount of space required for equipment set-up, and consolidate controls, switches, etc. to simplify operations. In particular, power, cooling, and control modules are commonly stackable to provide numerous different configurations. Also, power modules having a common set of predetermined operating characteristics are available and are conveniently stackable to provide, for example, a multiple of a standard amperage. This reduces the number of types of power supplies required further reducing equipment costs.

A still further object of the invention is to provide stackable, modularized plasma cutting apparatus which is usable with a variety of torches and power requirements, detects which type torch is being utilized for a particular cutting operation, and automatically provides the appropriate cutting control strategy for the particular, torch, power requirement, and cooling configuration. In this regard, the control portion of the apparatus is "smart" in that there is a built-in torch identification, the number of stacked power modules actually being used for a cutting operation is displayed so the user knows exactly how much power is used in a welding operation, and the control strategy, for example, reduces current when the user contacts metal during a "drag" mode of operation.

A further object of this invention is to provide means for electronically detecting the type of torch that is being utilized in the cutting operation, or which has been installed into the system, and which provides through its connecting feature an immediate identification which instructs the logic module which torch is on the system, and how the power characteristics for the apparatus must be converted to accommodate that particular torch; the type of torches as known in the art for use in conjunction with such equipment including either a single gas torch, dual gas torch, a liquid cool torch, with the system of this invention incorporating dynamics that provide for immediate gas selection, maximum output, pilot current setting and drag cutting limit of each torch after its identification has been determined.

An additional object of the invention is a stackable, modularized, apparatus in which the stacked modules are readily interconnected so to not be dislodged one from the other and to be easily transportable.

Yet another object of the invention is to provide stackable modules in which all electrical wiring, signal connections, and power connections are integral to the module. This eliminates generally the need for external electrical wiring between modules.

A further object of the invention is to provide a separate regulated power supply module which provides stable, consistent performance regardless of input line characteristics or the condition of consumable parts of the torch.

Still another object of the invention is to provide modules whose enclosures have an outer skin covering which provides strength, durability, and electrical safety.

Yet another object of this invention is to provide for connector means between power and control modules for this invention, which allows for their convenient stackability, so as to build a plurality of power units in combination with the control for operations of the torch, to meet the demands of the particular job being undertaken.

Another object of this invention is to provide for the unique and controlled operations of the cooling fans, within the power units, such that the circulating fans function only when the trigger upon the torch is initiated, as during a cutting cycle, so as to not to permanently run and continuously draw contaminated air into the power units during functioning of the device.

Another advantage of providing for the staggered operations of the cooling fans within the power units is that it has a tendency to maintain the electronics and other components within the power units at a consistent temperature, regardless of the number of power modules that may be stacked into the device, to assure uniformity of temperature, throughout the stacked power units, during their operation. Thus, when a cutting operation is taking place, and the power units are operating, the cooling fans have a tendency to effect a cooling of the electronic components for each power unit, during that period of time when the electronics are operating and functioning, and have a tendency to elevate in temperature, but that when the cutting torch is shut off, such that obviously the electronics of the power unit likewise are turned off, they do not heat up at that time, and maintaining their cooling is not a difficult task. Hence, uniformity of cooling is maintained for the electronics of the power units, through the staggered operations of the fans, in this manner.

Still a further object of this invention is the provision of electronics for use in finely regulating the varied operations of the cutting and welding apparatus of this invention, and which includes the combination of logic means, analog regulating means, and visual digital display means, within the control module of this invention, and which regulates the power developed from the power module, during functioning of the device; with these components incorporating unique electronics that furnish, as for example, in the power module, cross coupled windings for attaining mid-point capacitor balancing for consistent and uniform operations of a power module; further includes interleaved power topology, for attaining consistent power output from each power module; incorporates regulated OC voltage capability, to attain quality cut, to enhance part's life of the apparatus, and to assure consistency of operation; further incorporates the electronics means for attaining, as previously explained, immediate torch identification; and includes magnetic snubbing of the output rectifiers, to maintain precision in apparatus functioning on a consistent basis.

Yet a primary function of this invention, and one of its principal objectives, in view of the enhancements as previously explained, is to incorporate such improvements into welding apparatus.

In accordance with the invention, generally stated, plasma cutting apparatus is for use in cutting a material such as steel as part of a manufacturing operation. The apparatus first comprises a cutting torch for cutting the material, the torch being any one of a wide variety of torches, whether the selected torch be one of a single or dual gas torch, or of a liquid or air cooled type. A control unit is provided for controlling the cutting operation performed using the torches. The control unit is housed in a control module. One or more power supply units for supplying power to the cutting torch are also available. Application of power by the power supply units is controlled by the control unit. Each power unit is separately housed in a power module and the control module and power modules are readily, removably stackable one on top of the other to facilitate set-up changes from one cutting operation to another. A cooling module is also available which is removably stackable with the control module and power modules. Other objects and features will be in part apparent and in part pointed out hereinafter.

BRIEF DESCRIPTION OF THE DRAWINGS

FIG. 1 is an isometric view of a stacked configuration of power, cooling, and control modules of the apparatus of the present invention;

FIG. 8 is a perspective view of an electrical conductor comprising one segment of a power feeder produced by stacking a number of power modules of the apparatus;

FIGS. 14A and 14B disclose the circuit diagram for the logic means, as previously reviewed in FIG. 4;

FIG. 15 discloses the high frequency generator as previously reviewed in FIG. 4.

Corresponding reference characters indicate corresponding part throughout the drawings.

DESCRIPTION OF A PREFERRED EMBODIMENT

Figure 6B:
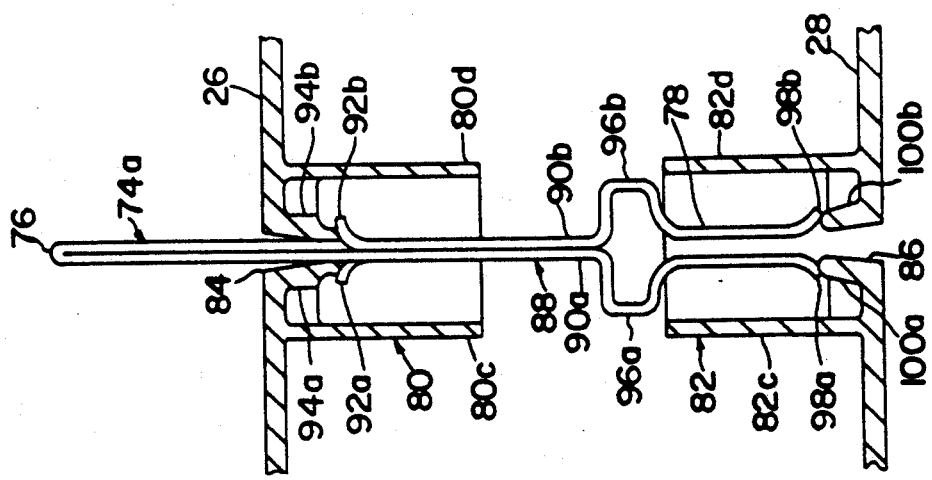
FIGS. 6A and 6B are front and side elevational views of the electrical interconnection, or connectors, between adjacent stacked modules.

Referring to the drawings, modular, stackable plasma cutting apparatus of the present invention is indicated generally 10. The apparatus is useful in manufacturing operations in which plasma arc cutting of metal is performed. Although, the concepts of this invention can be embodied in welding equipment in general. For the specific purpose, apparatus 10 includes a cutting torch 12 which produces a plasma arc P for cutting a metal piece M. It will be understood that a variety of torches 12 can be used with the apparatus and the torches have different power requirements for different cutting operations, as previously summarized. In general, the torches disclosed in any of the following United States patents, and which are assigned to the same assignee as the present application, are incorporated herein by reference, are usable with apparatus 10: U.S. Pat. Nos. 4,748,312; 4,701,590; 4,691,094; 4,581,516; 4,558,201; and 3,813,510. Circuitry and flow configurations for such torches, owned by the same assignee, are shown in U.S. Pat. Nos. 4,170,727; 4,225,769; 4,324,971; 4,663,512; 4,663,515; 4,585,921. It is a feature of apparatus 10 that it accommodates each of the various torches and automatically adjusts both for the type of torch used and the application for which the torch is employed.

In addition to the torch, apparatus 10 includes a control means 14 (see FIG. 4) for controlling a cutting operation performed using the torch. The control means includes a control module 16 in which the control means, which will be described hereinafter, is housed. Module 16, as shown in FIG. 1, is the uppermost module in the stack of modules shown in the Fig. The apparatus further includes at least one power means 18 (see FIG. 3), for supplying power to the cutting torch. The power means supplies DC power to the control means. The power means is connectable to a variety of power sources, including both single-phase or three-phase AC power, and both high or low voltage levels. The application of this power is controlled by control means 14. That is, the cutting torch is connected to the apparatus via a cable assembly 20 one end of which is connected to an appropriate fitting or connector 22 on control module 16. Power produced by the power means is routed to the cable assembly through the control module. As with the control means, the power means includes one or more power modules 24 in which the power means is housed.

Figure 2:
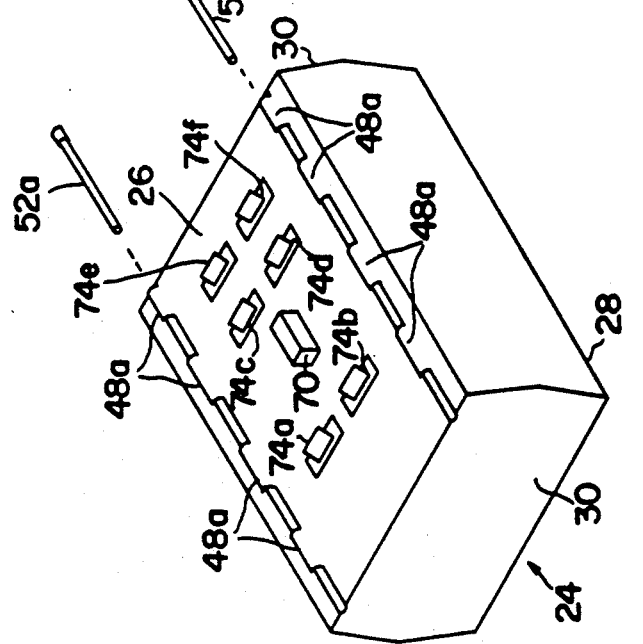
FIG. 2 is an isometric view of a power module of the apparatus illustrating the connectors by which one power module is electrically connected with another.
Figure 7:
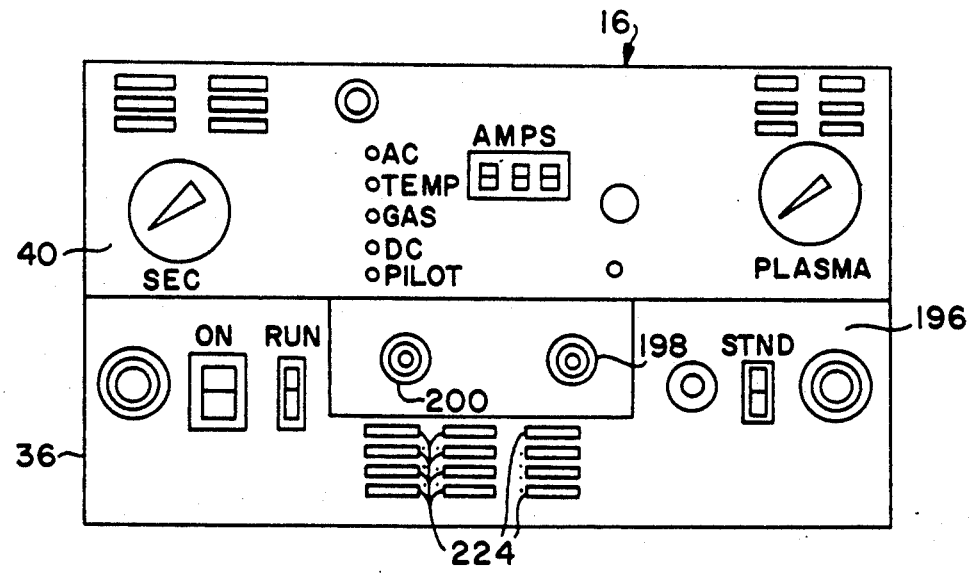
FIG. 7 is an elevational view of the front face of the control module.

The control module and power modules are removably stackable one on top of the other. As seen in FIG. 1, two power modules 24 are stacked, one above the other, and control module 16 is stacked on top the uppermost power module. In apparatus 10 up to four power modules can be used. As can be seen in FIG. 2, each power module has a rectangular top 26, bottom 28, and canted side walls 30. As can be seen, each of the power modules are formed of upper and lower separable halves, which may preferably be formed from injection or other molded polymer, such as polystyrene, or the like, such that when an upper and lower half of the module are interfitted together, they form a complete unit, for embodying their particular components, and electrical circuitry panel boards. In addition, the cooling module, in addition to the control module, may likewise be formed of upper and lower separable halves, to facilitate their assembly. The control module has a rectangular top 32, bottom 34, and front and rear walls 36 and 38 respectively, as shown in FIG. 1. The height of front wall 36 is less than that of the rear wall because the control module has a control panel 40 which angles rearwardly from the upper end of the front panel to the front of the top panel. As shown in FIG. 7, various switches, indicators, connectors, and controls are mounted in both panel 36 and panel 40. The function of these various elements is described in more detail hereinafter. The control module has side panels 42 whose outline conforms to that created by the front, back, and control panels. It will be understood that the top and bottom of each of the power modules, as well as the bottom of the control module are of the same size to facilitate aligned stacking of the modules. The rectangular top 32 includes a pivotally opened door, as at 32A, which opens up into a shallow compartment, wherein various supplies, torch tips and electrodes, and other components, may be temporarily stored.

In addition to the modules, apparatus 10 also includes a rectangular plate 44 forming a base for the stack. The plate has the same size as the bottom of the power and control modules to simplify stacking of one of these modules on the base plate. The apparatus further includes a hinge 46 similar to a piano hinge, formed at the upper and lower corners of adjacent, stacked modules so the modules can be mechanically joined and thereafter not dislodged from one another. As seen in FIG. 1, each hinge segment 48 is formed at the juncture of the bottom and side of one module. Interfitting hinge segments 50 are formed at the arris of the top and side of the module on which the other module is placed. After the modules are stacked, a hinge pin 52 is inserted through the segments on both sides, to interlock the modules together. When the stack is to be reconfigured, the pins are removed. Base plate 44 has a similar hinge means construction to the modules so the base plate can be interlocked with the module stacked on top of it. Alternatively, and as shown in FIG. 2, hinge segments 48a are formed on the top surface of the module. Interfitting hinge segments (not shown) are formed on the bottom surface of the module to be stacked on top of module 24. Hinge pins 52a are then inserted through the interfitting segments to lock the adjacent modules together. A removable handle 55, two of which are provided with the apparatus, one on either side, is shown in FIG. 1. The handles are removably attachable to the stack of modules, as they are interlocked, so the entire stack can be readily transported from one location to another.

Figure 5:
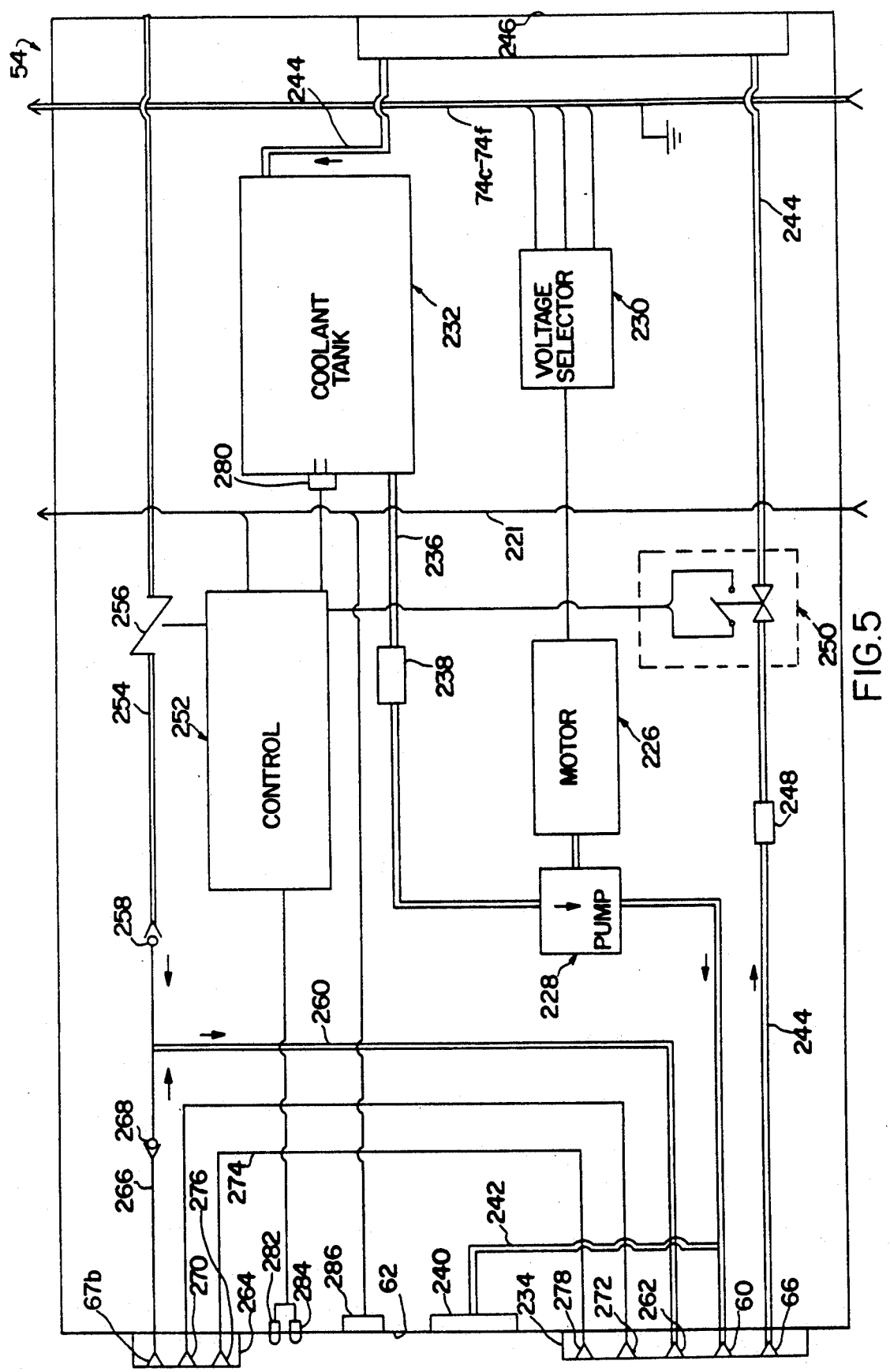

Besides the power and control means, apparatus 10 also may include a coolant means 54 (see FIG. 5). The coolant means includes a coolant module 56 which is stackable with the other modules. Module 56, if used, is placed at the bottom of the modular stack. The size and shape of this module is similar to the power modules 24. When used, a coolant line 58 is attached to an appropriate fitting 60 on a front panel 62 of the module. This line runs to the torch assembly. A coolant return line 64 also runs between the coolant module and the torch. This line connects to a fitting 66 on panel 62. A secondary coolant supply line 67 of the module connects to an appropriate connector 68 on panel 62. In addition, an umbilical supply line interconnects between the control module 16 and the coolant module 56, as shown along the line 67a, and this particular line conducts gas from the control module down to the coolant module, so as to provide for the supply of coolant, and gases, to the coolant module, for operations of the device. This is a jumper line for the gases and the torch power, to get it transferred to the coolant module 56.

Figure 6A:
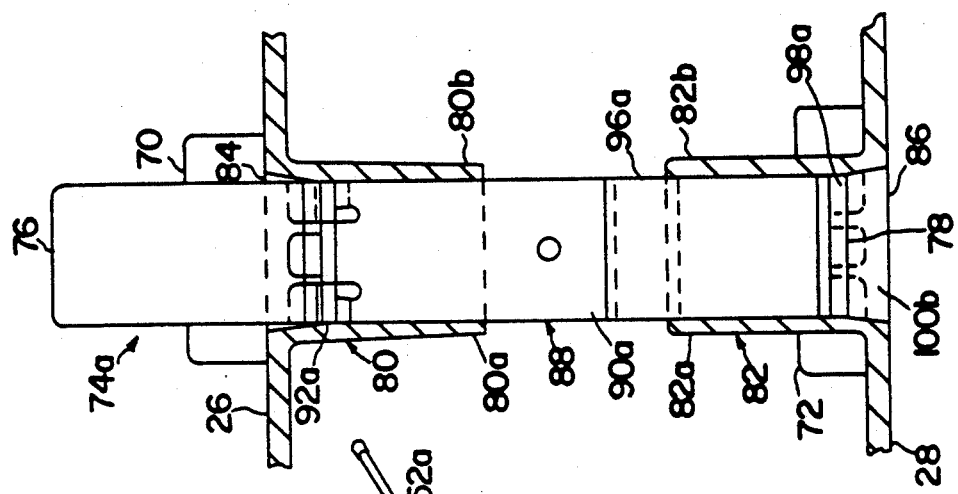

Referring to FIGS. 2, 6A and 6B, the electrical and control interconnections for the modules are shown. A multi-pin connector 70 is located approximately in the center of the top of each module, and the connector extends above the top surface. A mating connector 72 (see FIG. 6A) is mounted internally of the module, inside the bottom wall of the module. Consequently, when the modules are stacked, connector 72 is seated on connector 70 as one module is placed atop the other. Control lines for providing control interconnections from module 16, and return signals to the control module are routed through the mated connections at each module interface.

With respect to the power connections, either DC power, or single- or multi-phase AC power is provided by the power means. Consequently, six electrical connections are made between each module. Two connections are DC connections, and the other four accommodate the three-phase AC power, with a ground line. For this purpose, six electrical conductors 74a-74f are installed in each module with the upper end 76 of each conductor extending above top face 26 of the module. The conductors 74a-74f of one module interconnect with the corresponding conductors on the other stacked modules to form, in effect, a vertical power or voltage feeder. Each conductor is preferably of copper and is capable of carrying at least up to, for example, 140 amps of current at a three-phase line voltage of up to 460 vAC. The overall height of each conductor is such that it extends from the bottom of the module to approximately two inches (2.0 in., 5.1 cm.), for example, more or less, above the top surface of the module. Each conductor further has the blade end 76, which is the portion of the conductor extending above the module, and a connector end 78, which is located within the module at its lower end, and into which the prong node end of the conductor in the module below is received.

As shown in FIGS. 6A and 6B, supports 80 and 82 are respectively formed or molded on the inside of the module at both the top and bottom of the said module. Supports 80 and 82 are each generally square in cross-section and include respective side walls 80a-80d, and 82a-82d. The width of the conductor corresponds to that of the walls so as to fit snuggly within the supports. The upper end of each conductor fits through a rectangular slot 84 formed in the top of the module. A corresponding slot 86 is formed in the bottom of the module. Referring to FIG. 8, a conductor 74 is formed from a single bar 88 of copper or other conductor material. The bar is folded back over on itself to form two sides 90a, 90b of the conductor. The end of the conductor produced by the fold is its blade end 76. The outwardly extending spacer tabs 92a, 92b are formed on the respective sides of the conducted at the upper end of the bar. As best seen in FIG. 6B, downwardly extending shoulders 94a, 94b define slot 84 in the top of the module. Blade end 76 of the bar is inserted through the slot until the tabs abut against the inner end of these shoulders. When they do, the desired length of the conductor extends above the top of the module. The connector end of the bar is created by first forming an outwardly extending bow in each side of the bar, as indicated at 96a, 96b. At the lower end of the bow, the sides of the bar are spatially separated to form a female receptacle for the prong end of the conductor in the module upon which this module is stacked. The lower ends of the respective sides are flared outwardly as indicated at 98a, 98b to facilitate reception. Upwardly extending shoulders 100a, 100b define slot 86 in the bottom of the module. The flared ends of the conductor seat on the inner end of these shoulders. While the above discussion has been with respect to the power module of FIG. 2, it will be understood that the control and power feeder configurations are reasonably the same for each of the modules which are interconnected with the power modules.

Figure 3:
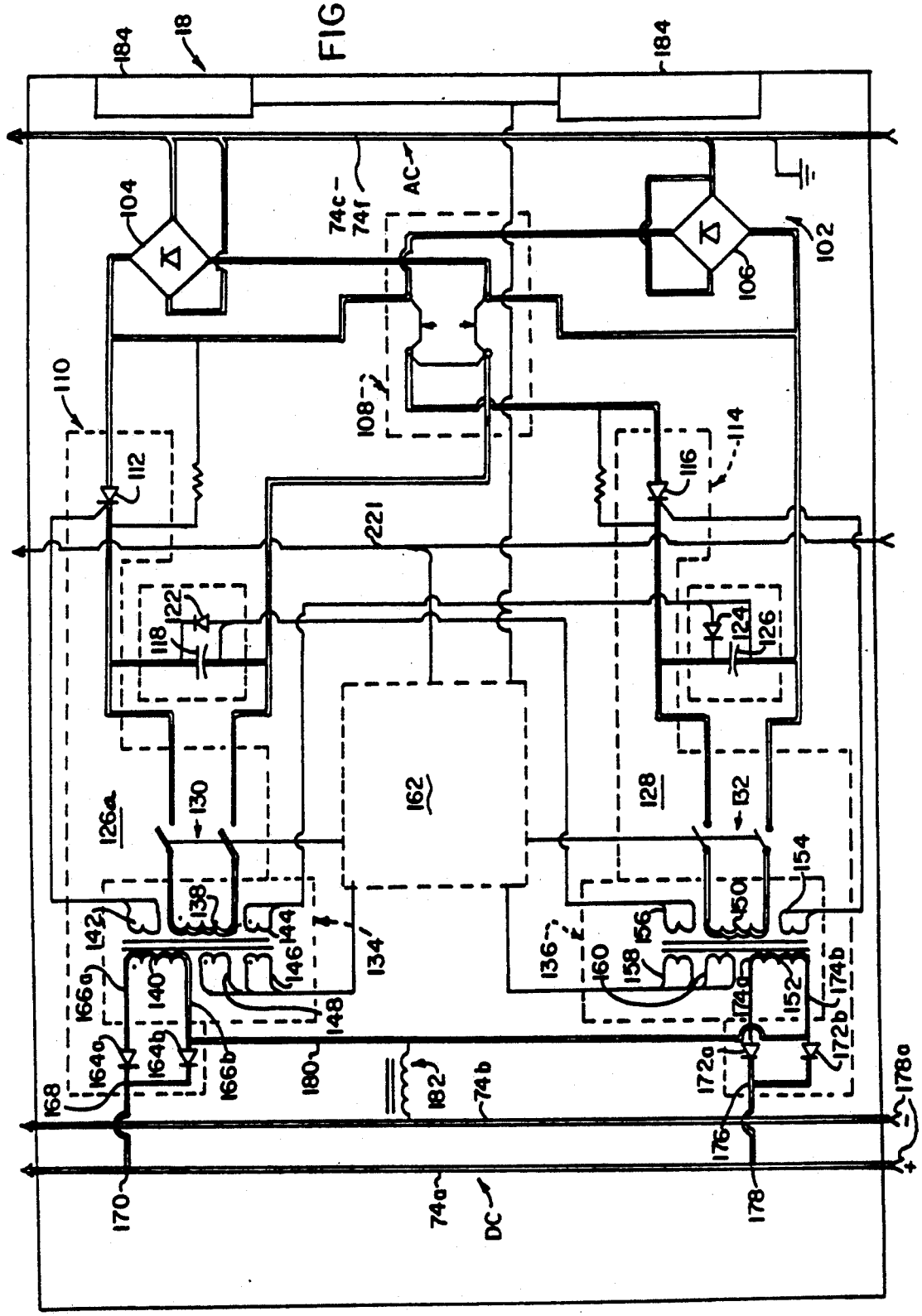
FIGS. 3-5 are respective block diagrams of a power module, control module, and coolant module.
Figure 4:
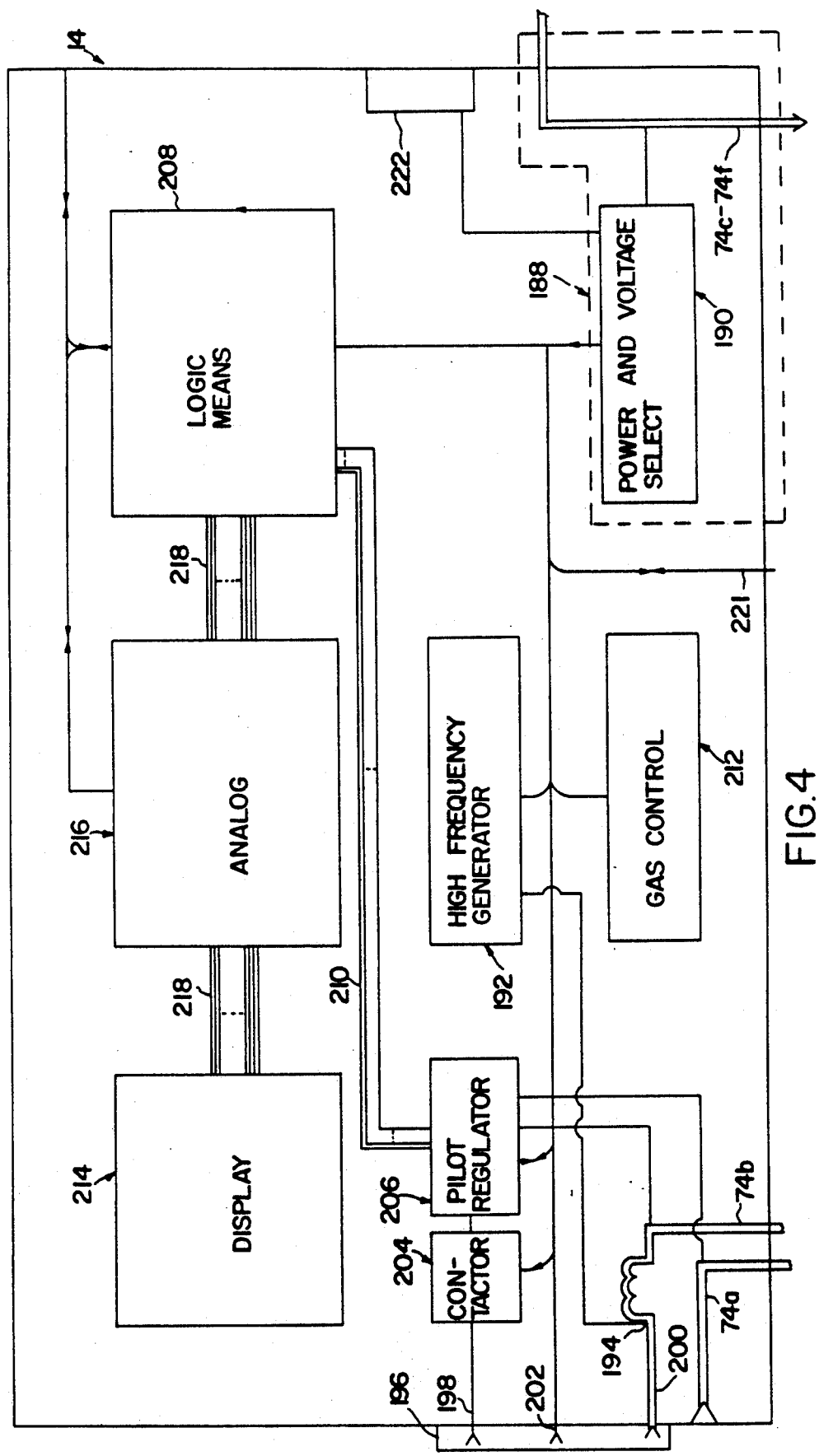

Before describing the control, power, and coolant means in detail, each means will be generally described using FIGS. 3-5. In these Figs., double lines are used to indicate high power lines, coolant pressure lines, etc. Single lines represent low voltage lines, control lines, signal lines. Referring to FIG. 3, power means 18 produces a high amperage current which is supplied via outputs 178a to a torch 12. The current is used at the torch to produce the plasma by which the material is cut. As previously noted, apparatus 10 can utilize both DC and single-phase or three-phase AC power. Further, the amperage supplied to the control means is a function of the number of power means employed. If each power module is capable of producing, for example, a 35 amp. current, use of two modules will produce 70 amps, and three modules 105 amps, and a four module stacked unit can produce 140 amps, etc. The DC voltage feeder buss for the module is shown on the left side of FIG. 3 and includes feeder represented by respective conductors 74a, 74b. The AC power lines 74c-74f are shown on the right side of the Fig., although DC can be inputted through these leads also. Because apparatus 10 can be connected to an AC power source, means 18 includes an AC-DC converter 102 for producing required DC power. The converter includes the first and second full-wave rectifier means 104, 106 respectively. If single-phase power is utilized, rectifiers 104 and 106 are used to produce a full-wave rectified waveform. If three-phase power is utilized, rectifier 104 is used for two of the three phases, and rectifier 106 for the third phase. The rectified output from 104 and 106 is provided to a two position voltage selection switching means 108. In one position, the output voltage from the means is 350 VDC, while when switched to its other position, the output voltage is 700 VDC. The output of said rectifiers is provided to both one input of switching module 108, as well as subsequently conducted to an in-rush current limiter 110. Limiter 110 includes a silicon controlled rectifier (SCR) 112. The output of the switching means is also provided to a second in-rush current limiter 114 which includes an SCR 116. The rectified output of rectifier 104, or of switching means 108, is supplied to respective filter capacitors 118 and 126. After filtering, the rectified waveforms are supplied to respective switching transistor modules 126a, 128 which are described in more detail hereinafter. Each switching module includes a switch 130, 132 respectively, for controlling application of the respective rectified waveforms to the primary windings of a power transformer 134, 136 respectively. This provides for cross coupled windings for attaining mid-point capacitor balancing.

Transformer 134 has a primary winding 138, a high level secondary winding 140 and 144 and a plurality of low power (or step-down) secondary windings 142, 146, and 148. Similarly, transformer 136 has a primary winding 150, a high power secondary winding 152 and 156, and a plurality of step-down secondary windings 154, 158, 160. The stepped-down output from winding 142, for example, is connected to the gate input of SCR 112, as is the stepped-down output from winding 154 to SCR 116. The output from winding 144 is applied to the diode 124 for rectification and conducted to the capacitor(s) 126; while, the output from winding 156 is applied in a similar manner to diode 122 and to the capacitor 118. The stepped-down output of windings 146, 148 are additively combined and supplied to a control and gate drive circuit means 162, whose operation is described in more detail hereinafter. The additively combined stepped-down output of windings 158, 160 are also supplied to means 162.

Conductor 74a is the positive DC power line, and conductor 74b the negative DC line. Thus, the high power output from the secondary windings 140 and 152 are each applied to conductor 74a after rectification and filtering. Rectifier diodes 164a, 164b are connected in the respective output lines 166a, 166b of winding 140. These lines are connected at a node 168 for the rectified output from transformer 134 to be supplied to line 74a. For this purpose, node 168 is connected to conductor 74a at a tie point 170. Rectifier diodes 172a, 172b are connected to respective output lines 174a, 174b of winding 152. Lines 174a, 174b are connected at a node 176, which, in turn, is connected to conductor 74a at a tie point 178. Lines 166b and 174b are interconnected by a line 180. An output inductor 182 is connected between line 180 and conductor 74b.

The power module also includes fans 184 located in the rear of module 24. The fans are controlled by the control and gate drive circuit means 162 and draw air through a series of louvers 186 in the front panel of the module for cooling module 24. The fans only operate as previously stated, when the torch pilot is initiated and the torch is cutting; they are shut off during all other times.

Referring to FIG. 4, control means 14 includes a power input section 188. Single-phase or three-phase power for the apparatus is connected to appropriate connectors located proximate the bottom of module 16. This power is then routed to the power feeder constituted by conductors 74c-74f so to be delivered to the power modules 24. A power and voltage select means 190, to be described in more detail hereinafter, is responsive to the the input being either single-phase or three-phase, and the voltage level of the input. The high voltage DC power produced by the power means, as aforesaid, is returned to the control means on lines 74a, 74b and routed through the control module, and then via cable assembly 20 to torch 12. Specifically, the positive DC on conductor 74a is routed through the cable assembly 20a to the metal M comprising the workpiece, and the negative conductor 74b to the torch via line 20. A high frequency generator 192 produces a high frequency signal which is impressed on conductor 74b at a node 194. The high frequency signal is used to create ignition sparks to initially fire torch 12.

Figure 7A:
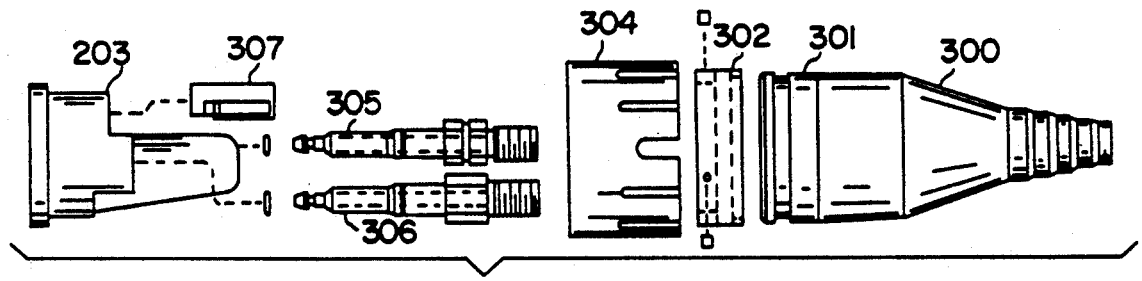
FIGS. 7A-7B are exploded views of the connector that is used to interconnect the torch line to the front panel of the control module.
Figure 7B:
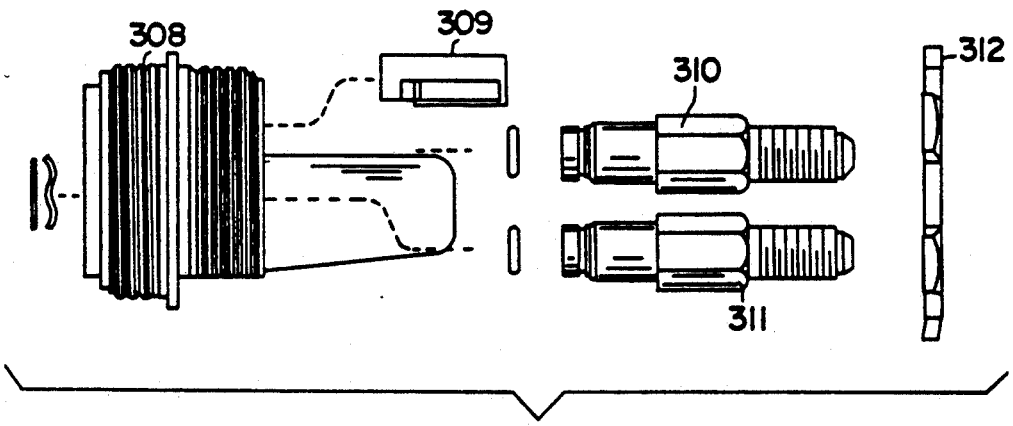

As shown in FIGS. 1, 4, 7, 7a and 7b, the cable assembly 20 extending from the control module to the torch is attached to connectors mounted on a panel 196 on the front of the control module. FIG. 7a discloses the preferred form of connector that is used to interconnect the torch line to the front panel 196 of the control module. This connector includes the line 300 that interconnects by way of the cable 20 to the torch, as previously described. The front of the connector forms a boot 301, which is held by means of a sleeve 302 tightly to the periphery of the disconnect housing 303, and which are held into position by means of the nut 304 that encases the entire connector assembly. The particular leads that extend from the housing 303 include a first fitting 305, which conducts the plasma gas and the pilot electrical current to the torch. The fitting 306 conducts the secondary gas and the main cutting current to the said torch. In addition, the electrical signals from the torch to the controls are interconnected via the thirteen pin connector housing 307. Thus, all power, whether it be electrical, or gas, are conducted to the torch by means of a single disconnect fitting. Likewise, as can be seen in FIG. 7b, the interconnection with the disconnect assembly within the control module 16, and more specifically a proximate central location of its panel 196, is made by means of the receptacle housing 308, which is permanently mounted to the said panel. Likewise, the signal from the torch that is transmitted to the connector housing 307 is electrically conducted through the multi-socket connector block 309, from 307, for transmission to the electrical circuits of the control module. In addition, the connectors for the fittings 305 and 306, comprise, respectively, the connector pin receptacle 310 and 311, as noted. Finally, the receptacle housing 308 is permanently affixed into position by means of the conduit nut at 312, which is applied in the usual manner. In any event, what should be understood upon reviewing the definition of this disconnect assembly, is that the entire cable 20, which conducts both electrics, and gas, to the torch, can be interfitted together by a single connection, and easily removed, once again, by a singular disconnect.

Thus different type torches can be quickly installed upon the apparatus. Panel 196, in a second embodiment, has a first connector 200 for the negative DC running to the torch. FIGS. 4 and 7. A connector 198 is for the pilot electrical and plasma gas for the torch. Control signals from the torch are routed to the logic means by line 202. With respect to the pilot, control means 16 includes a contactor 204 for the pilot, and a pilot regulator means 206. A logic means 208 controls operation of the regulator 206 via control signals routed to the regulator over a ribbon connector 210. Control signals flowing to and from the control module are routed to the logic means. The power and voltage select 190, selects and converts the proper voltage level for transmission to the control module, including the high frequency generator 192, and a gas control module 212 which operates solenoids, pressure switches, gas regulators, etc. The control means includes a plurality of displays, including amperage displays, which are mounted on the front of panel 16 and which indicate the operating status of the apparatus. FIG. 7. A display means 214 governs the various displays, and module 214 is connected to the logic means through an analog means 216 which includes various display driving logic, scaling, etc. Display module 214 connects through ribbon means 218 to both the analog means 216, and the logic means via the same ribbon connector 218. Inputs to, and outputs from, the logic means to the other means is via a multi-pin cable 221. The interface for this cable between the various means has been previously described. The display readings are shown on the front panels of the control module.

As with module 24, module 16 has a fan 222 by which air drawn into the module through operations of the fan and out the louvers 224 on the front of the module, and is continuously circulated through the module thereby. Fan 222 is controlled by the power and voltage select module 190.

Referring to FIG. 5, coolant means 54 of the coolant module 56 includes a motor 226 which operates a pump 228. A voltage selector 230 is connected between conductors 74c-74f to provide voltage from each input phase to the motor to run it. Fluid in a coolant tank 232 is pumped from the tank to the torch through the coolant supply outlet connection 60. This connection is part of a connector panel 234 on front panel 62 of the coolant module. The fluid is pumped by way of a fluid line 236 through an in-line filter 238. A pressure gauge 240 measures the in-line pressure via a pressure test line 242. A coolant return line 244 has an inlet connection 66 from the torch assembly. The return line runs from the inlet to a heat exchanger 246, through the heat exchanger, and back to the coolant tank. The return line also includes an in-line filter 248, and a flow control switch 250. This switches' operation controls a control means 252. A fan for the coolant module is incorporated with the heat exchanger 246.

A secondary water line 254 supplies a water shield, in lieu of gas, to shield the torch during operation, when that type of torch is selected. A solenoid valve 256 is operable by the control circuit 252 to allow secondary water shield to flow through the line. A check valve, when opened, additionally allows secondary water shield to flow through a line 260 to an outlet connection 262. While secondary water flows through line 254 is a liquid (e.g., water), the secondary shield can also be a gas which is supplied to the coolant module through the inlet connection 68. Connection 67b is part of a connector panel 264 on front panel 62 of the coolant module. Gas flow is then routed through a line 266 and past a check valve 268 into line 260. Plasma gas for the torch is supplied to the coolant module through an inlet connection 270. This gas is routed to a connector 272 on panel 234. This plasma gas connection is to provide gas for the pilot and for complete cutting operations of the torch. A series of torch control circuit lines 274 have an inlet connection 276 on panel 264, and an outlet connection 278 on panel 234.

A conductivity probe 280 is inserted in tank 232 and provides an output to control means 252. The means supplies illumination inputs to respective flow and conductivity light emitting diodes (LEDs) 282 and 284 on front panel 62 of the coolant module. The LEDs indicate that coolant is flowing and the conductivity level is proper. Lastly, a switch 286 on the front panel is used to inform the control module that secondary gas is not needed, and turns on the solenoid 256 to instruct that secondary water shield is needed. Also, the switch can be used to instruct the control module that secondary gas is needed, when secondary coolant is in use.

Figure 9:
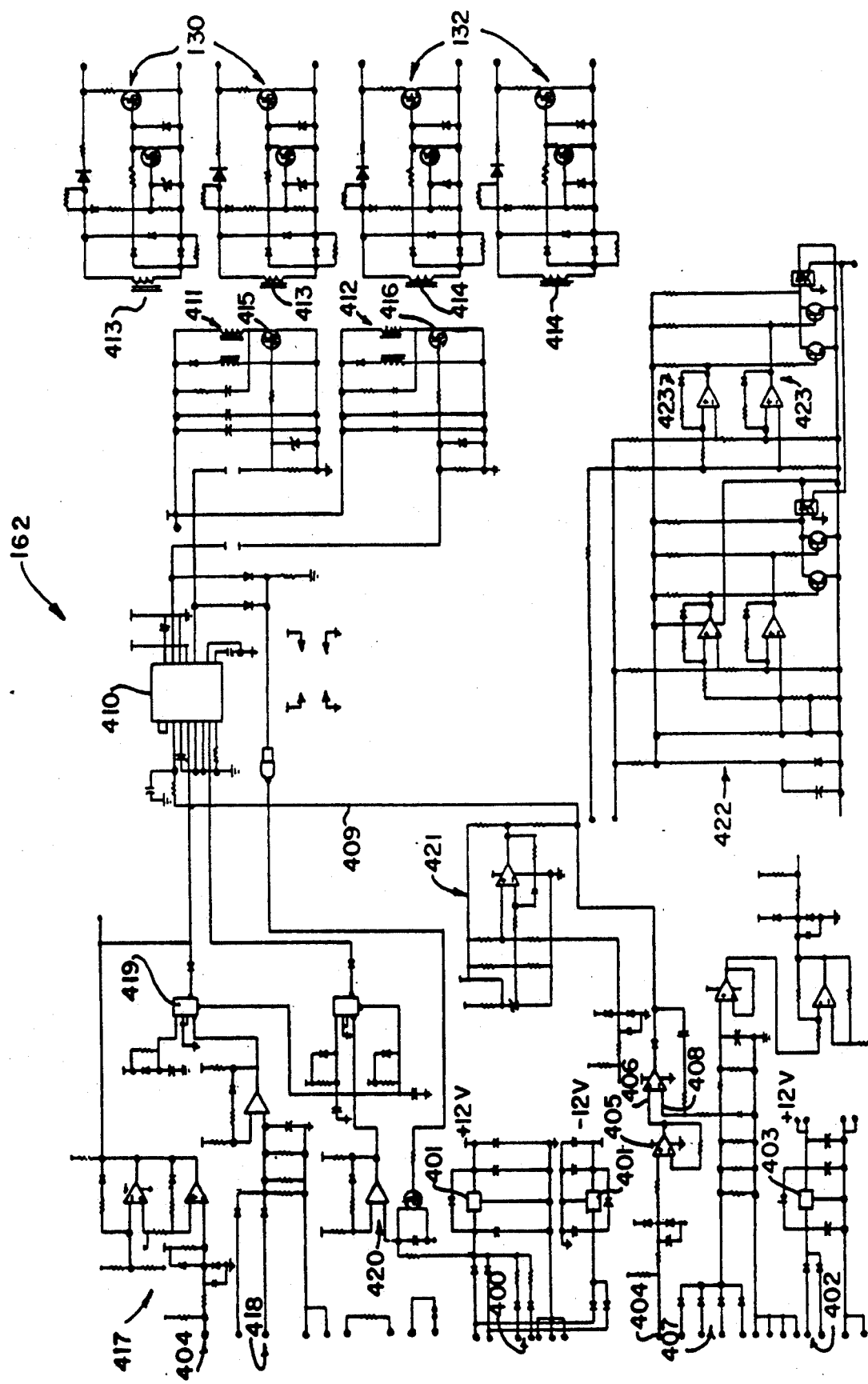
FIG. 9 is the detailed circuit diagram for the control and gate drive circuit means.

Previously, the schematic diagram of FIG. 3 was explained, showing the block diagram for the circuitry of the power module of this development. More specifically, in referring to FIG. 9, the circuit diagram for the control and gate drive circuit means 162 is shown. The purpose for this circuitry 162 is to provide for the control and regulation of the power regulated in the power module of this invention. Initially, the voltage inputted through the circuit lines 400 are processed by the diodes and the linear regulators 401, to provide for a generation and regulation of the voltage rails, which provides a uniform output of approximately +12 volts, and a −12 volts, where noted. In addition, the power inputted through the circuit lines 402 provide for a regulation of the voltage at that location, through the regulators 403, to provide an output of approximately 12 volts, where noted, for operations of the various fans of the power module. When the demand is made upon the apparatus for a particular range of power, or current, as by regulation of a variable knob upon the control panel 196, this particular demand is inputted through the circuit line 404, which signal is then buffered by the operational amplifier 405, and its voltage demand, as outputted, is conducted to one input of the current demand amplifier 406, which signal from the amplifier is then compared with the current feed back signal that is conducted through the circuitry, by way of circuit lines 407, and over the conductor 408, to the said current demand amplifier 406, for comparison. The difference between the two signals conducted to the amplifier 406 is then amplified, and conducted by way of the circuit line 409 to the pulse width modulator 410, where the pulse width duty cycle is varied, until the feed back signal inputted along the circuit lines 407, and the demand signal inputted into the conductor 404, become equivalent. The output of the chip 410 is fed to two gate drive transformers, 411 and 412, and the outputs from said transformers are conducted to the input gates 413, and 414, respectively of switches 415 and 416 which provide for the pulsing on and off of the transformers 411, and 412, respectively. Thus, the signals generated across the transformers 413 and 414 are delivered to the gates of the main power switches, comprising those previously identified gates 130 and 132, as shown in FIG. 3. The additional circuitry as seen in FIG. 9, is provided for furnishing a smooth and clean output signal for delivery to the said power devices 130 and 132. In addition to the foregoing, the circuitry does include various protection circuits within its embodiment. For example, an undervoltage protection circuitry is provided at 417, which essentially acts as a barrier against initiating operations of the entire circuitry, until the 12 volt output, or at least above 10 volts, is derived through the turn auxiliary windings 400. In addition, primary current limiting protection is provided through the circuit lines 418, which means if the current to the primary transformers 134 and 136, of FIG. 3, exceeds 40 amps, more or less, then the unit will shut down purposes. The monostable unit 419, provides for a temporary delay before the unit will be reinitiated, in order to satisfy that the amperage has been reduced to an operational level. Feed forward protection is provided through the circuitry disclosed at 420, which guarantees that the main transformers 134 and 136 do not saturate under any line conditions. The voltage that is conducted to the pilot, and the torch, before it is transferred, is controlled by the integrated circuit 421, so that whenever the transfer of the charge at the tip of the arc, of the torch, initiates a transfer or cutting sequence, this particular circuitry assures that the proper charge is maintained uniformly, and does not vary from the established and desired parameters. Furthermore, the circuitry as shown at 422 provides for the monitoring of the capacitor banks 118 and 126, to assure that the voltage on those banks is above a pre-established level, and does not exceed it, but is maintained at their desired settings, in order to provide and assure adequate operations of the unit. The comparitors 423 of this particular circuitry detects movement of the voltage away from the true midpoint of the capacitor bank, and if any deviation or variation of voltage becomes too excessive, as gauged, it will provide for a shutdown of the unit, until correction is made.

One additional signal, as provided along circuitry 404, is a module enabler that, when the operator initiates operations of the torch, this circuitry provides for the initiation of the entire circuitry, as shown in FIG. 9, to provide for actuation of the electronics, to achieve functioning of the device.

Figure 10:
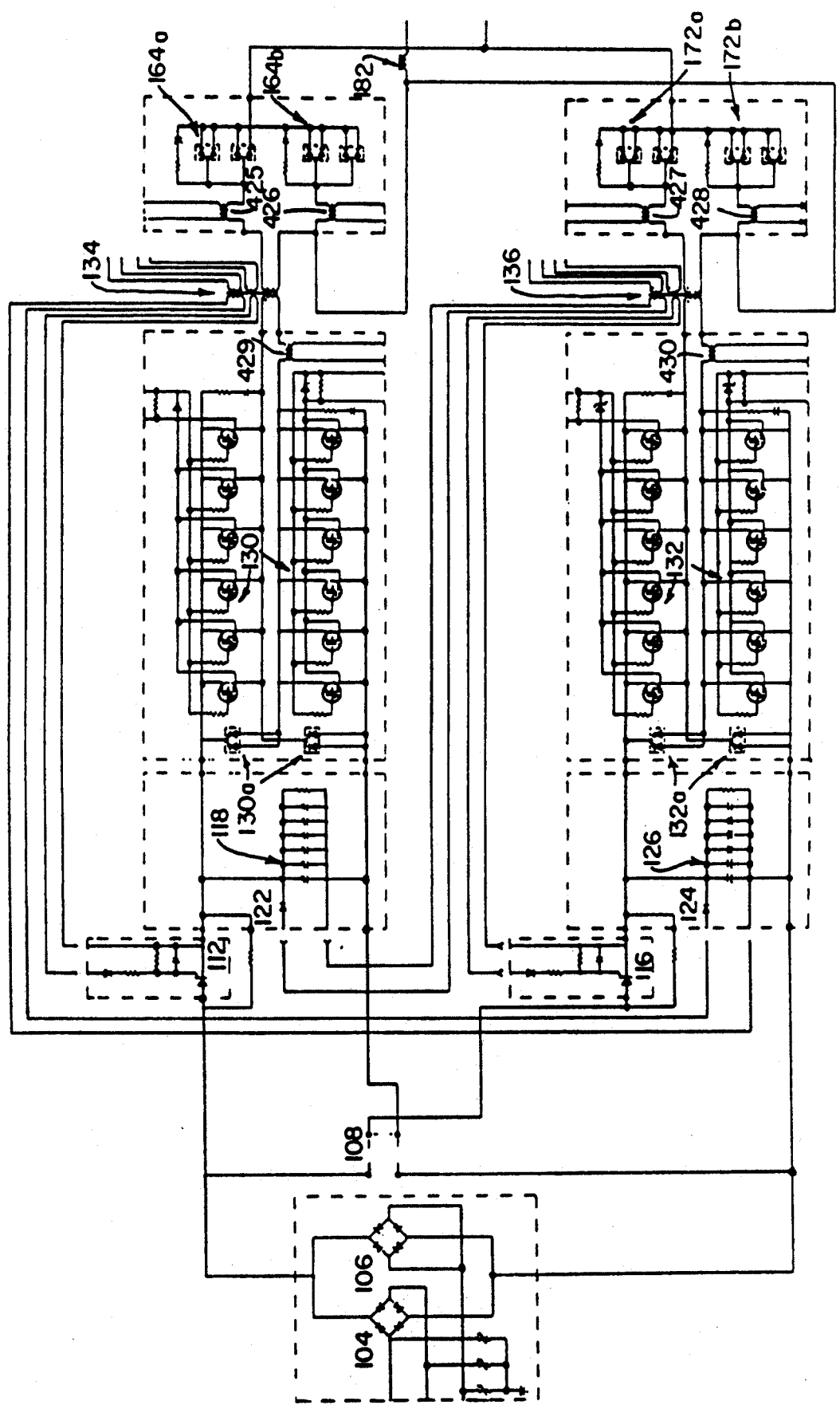
FIG. 10 discloses the power circuitry for the power module.

FIG. 10 discloses the power circuitry for the power module, as previously explained in FIG. 3. The circuitry as shown in FIG. 9 provides the control and gate drive functions for the power module, whereas this particular circuitry, as shown in FIG. 10, provides for driving of the power components. As can be seen, the transformers 134 and 136, are disclosed, and show the various leads from their primary and secondary windings. AC power coming into the unit from the connection 74c through 74f are rectified by means of the rectifier circuits 104 and 106. The output of these circuits is fed to the voltage selector switch 108, as previously defined. The output of the voltage selector switch is conducted to the capacitor banks 118 and 126, by way of the in rush limiting circuitry 112 and 116, respectively, via their silicon controlled rectifiers, as noted. The voltages that appear then across the capacitor banks 118 and 126, respectively, are then switched at high frequency by means of the power switches 130 and 132, as noted. The output of these switches is then fed to the primaries of the aforesaid transformers 134 and 136, with the secondary outputs from these transformers delivering their charge through the current sense transformers 425 through 428. In addition, there are current sensors 429 and 430 associated with the primary of said transformers, for functioning for the same purpose. Generally, these sense the currents at these locations, and feed into the control circuitry, as previously described. For example, the current sensors 429 and 430 are fed into the primary current limiter 418, as previously defined. The current sensors 425 through 428 are conducted into the current feedback circuitry 407, as previously explained, and function for their purpose as described. The output from the transformers are then rectified by the diodes 164a and 164b, in addition 172a and 172b, as noted. The rectified outputs from these diodes are then inputted into the output filter 182, as previously explained, and its signal is conducted to the output DC bus 74a and 74b.

As can further be seen, in FIG. 10, there are a series of catch diodes 130a and 132a, which have a function to return any energy generated from the transformers, respectively, 134 and 136, back into the capacitor banks 118 and 126, as defined.

Figure 11:
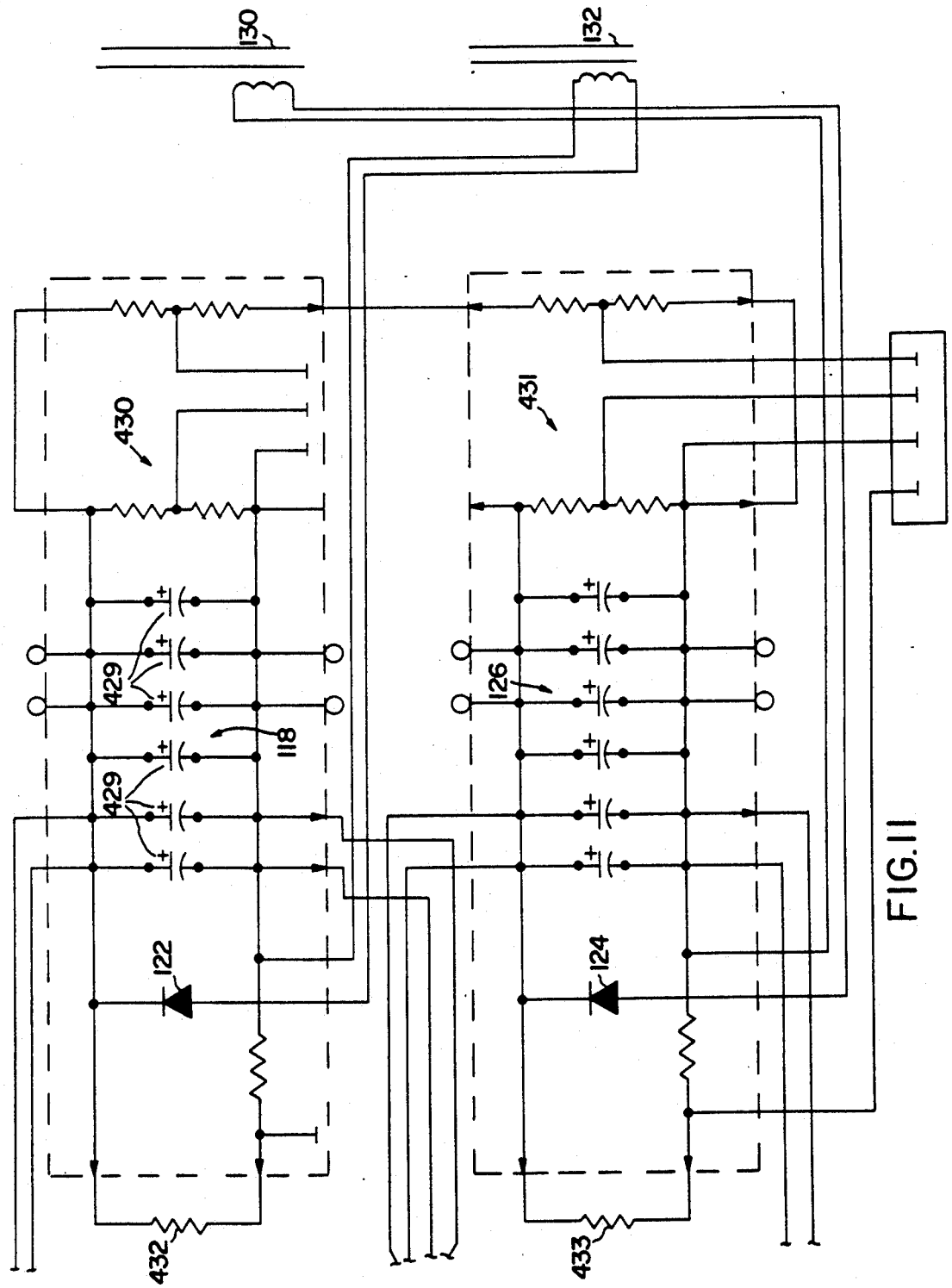
FIG. 11 discloses the capacitor banks for the power module, as previously shown in FIG. 10.

FIG. 11 more graphically discloses the circuitry for the capacitor banks 118 and 126. More particularly, the specific capacitors 429, as can be seen associated with the capacitor bank 118, function as a means for smoothing out the rectified input voltage to store power thereby, and to provide a near uniform signal, DC, that is then conducted to the various switches 130 and 132, as previously explained. The various resistances, 430, and 431, as noted, provide a detection of the output signal from the capacitor banks, and are inputted to the undervoltage and detector 422, and the midpoint voltage detector 423, to function as safety means within the equipment to dictate that the proper voltage is being maintained to assure adequate and reliable operations of the device.

The bleed resistors 432 and 433 provide for a draw down of any voltage maintained within the capacitor banks 118 and 126, so as to assure when the unit has been shut off, and being serviced, no remaining, residual, or hazardous voltage is yet contained within the unit, and which could be harmful to the serviceman. The diodes 122 and 124, have been previously explained, in their relationship to the capacitor banks 118 and 126.

Figure 12:
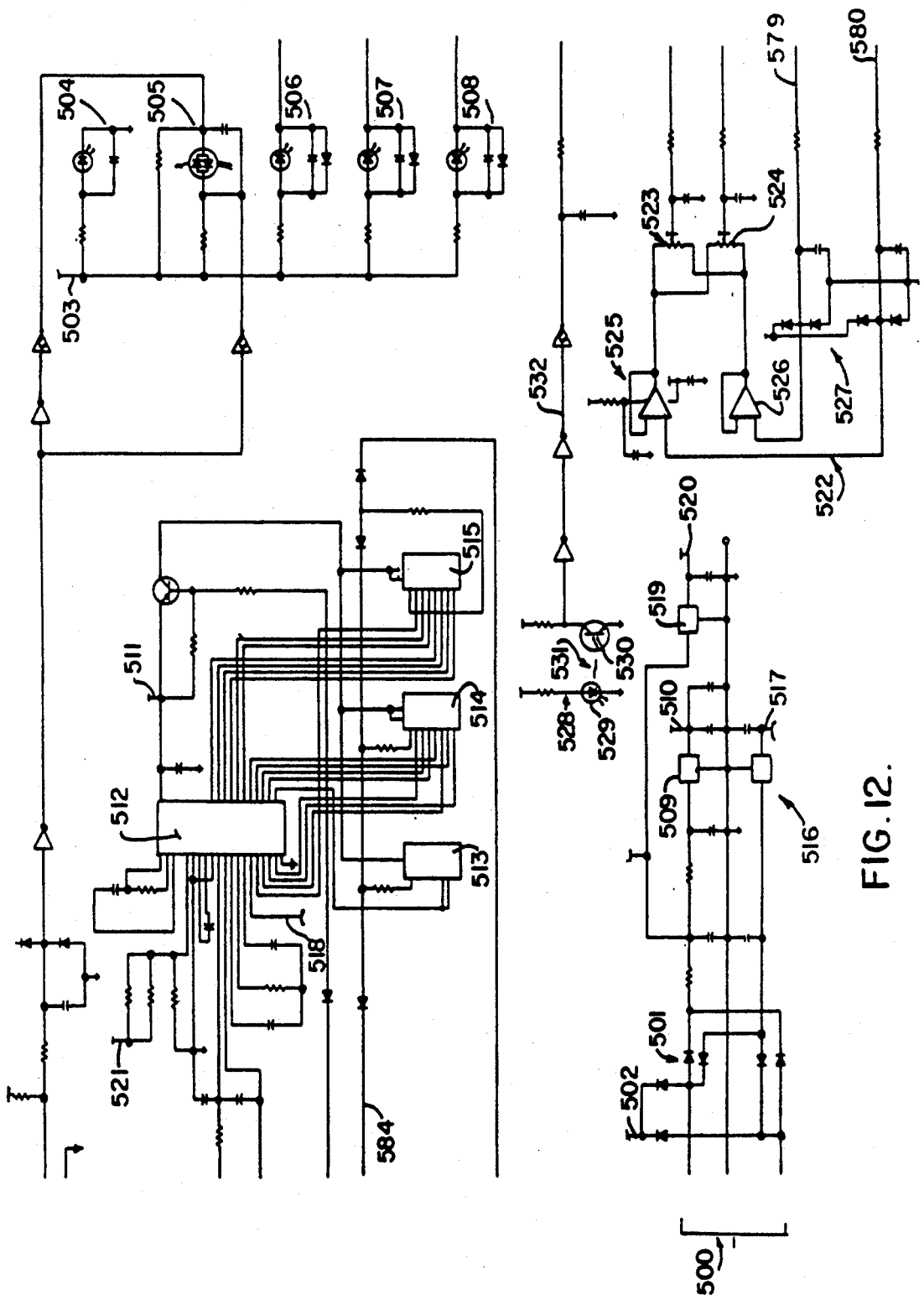
FIG. 12 discloses the circuitry for the display means as previously described in FIG. 4.

Previously, the schematic diagram for the control module was explained, as shown, in FIG. 4. More specifically, as can be seen in FIG. 12, the circuitry for the display means 214 is shown. The circuitry for the power supply for the display is shown at 500, wherein the incoming voltage is approximately 36 volts centertap, and it is rectified by means of the diodes 501, to provide various ± DC voltages, for operations of select components of the display. For example, the output at circuit line 502 is approximately a +20 volts. This particular output is delivered along the circuit line 503 for delivering power for operations of the status LEDs 504 through 508, for operations of the display, and furnishing visual information to the operator. In addition, the +DC voltage along the circuit line 500 is further conducted to the +5 volt regulator, as at 509, for providing a +5 volts DC output as along the circuit line 510, and this particular voltage is inputted along the circuit line 511 for supplying power to the digital amperage (AMPS) display, which was previously identified as the amps display upon the panel 40, of the control module 16, as previously explained with respect to FIG. 7. The output of the digital display 512 actually conducts its readouts to the visual readouts 513 through 515, to provide an observerable amperage readout of the device, and to inform the operator as to the amount of amperage at which the unit is operating, as in the preferred embodiment, as to whether it be at 35 amp, 70 amp, 105 amp, or 140 amp levels, depending upon the module selection, and the amperage desired, and for which the unit has been set. More specifically, this entire unit is settable between approximately 15 amps, up to the 140 amp level, and for any amperage level therebetween. Thus, this display provides a preview to the operator that the amperage level desired will have been set, and attained, before a torch cutting operation is begun. A −5 volts is provided along the −5 volt regulator 516, and its voltage is outputted through the circuit line 517 to the conductor 518, which is required to obtain the electrical operations of the display 512, as previously explained. A +10 volt regulator 519 is provided within the power supply, and its output is conducted by way of the circuit line 520 to the circuit line 521, and it provides a reference voltage for the digital display 512, during its functioning.

A further component of the display means 214, as shown circuit-wise in FIG. 12, includes the circuitry 522, and the purpose of this circuitry is to provide for a display, initially, of the preset amperage for operations of the torch, and this is set by way of the potentiometer 523. But, in the event that torch operator needs to slow down the cutting of the torch, as for example when a turn or curve is being made in the cutting pattern, if the amperage is not reduced at that time, a greater burn or wider cut may be made by the torch, which is undesirable. Therefore, a pre-established secondary setting may be made by the operator, as by setting of the potentiometer 524, and the switchover from the primary amperage at 523, and the secondary of said amperage at 524, may be made by the preprogram established from the cutting machine that provides movement for the torch, and which is processed by the analog board. Operating ranges for the set voltage requirement, or more specifically the upper and lower ranges of the operating voltages, are buffered by the operational amplifiers 525, as an upper setting, while the amplifier 526 functions as a detector of the lowest most voltage range that can be encountered during operations of the torch. To exceed or go below these particular ranges could be damaging to the torch, and therefore, these buffers, furnished by the operational amplifiers 525 and 526, are required. Filtering is provided by way of the diode circuits 527. As a variation upon this circuitry 522, the circuit 528 provides a quick means for detecting of the various amperages set by the potentiometer 524, or that lower voltage setting required when a slow down of the cutting torch is attained. More specifically, a light emitting diode 529 provides for the conduct of light to a photo transistor 530, and when the light beam, as at 531, is broken, it provides an immediate indication as to the lower voltage setting made at 524, and displays the setting by conduct of a representative electrical signal over the conductor 532, and is displayed upon digital displays 513 through 515. Thus, the operator, simply by, for example, placing a screw driver or some other instrument in the gap between these components 529 and 530, can get a quick reading as to the lower and reduced amperage setting.

It must be stated that these digital displays 513 through 515 have further attributes in their functioning, in that a decimal display may be provided upon the display 515, as a preview mode indication of the said amperage for the apparatus. For example, if four power modules are included, and the desired amperage is set at 140 amps, in the preview mode, a decimal will likewise appear within the display 515, to indicate what is that established amperage for the stacked unit. But, when the operator commences and continues a cutting operation, the decimals disappear, and such provides a true reading of the actual amperage generated by the apparatus, during a cutting cycle. Finally, when the operator has initiated the reduced current requirement, for cutting, or when the cutting control indicates that a slow down in cutting is to be encountered, then the decimals will appear within each display 513 through 515, to provide an accurate reading of the amperage set for the slow down cutting phase, and through the display of the plurality of decimals, lets the operator know what is the actual reduced current.

Figure 13:
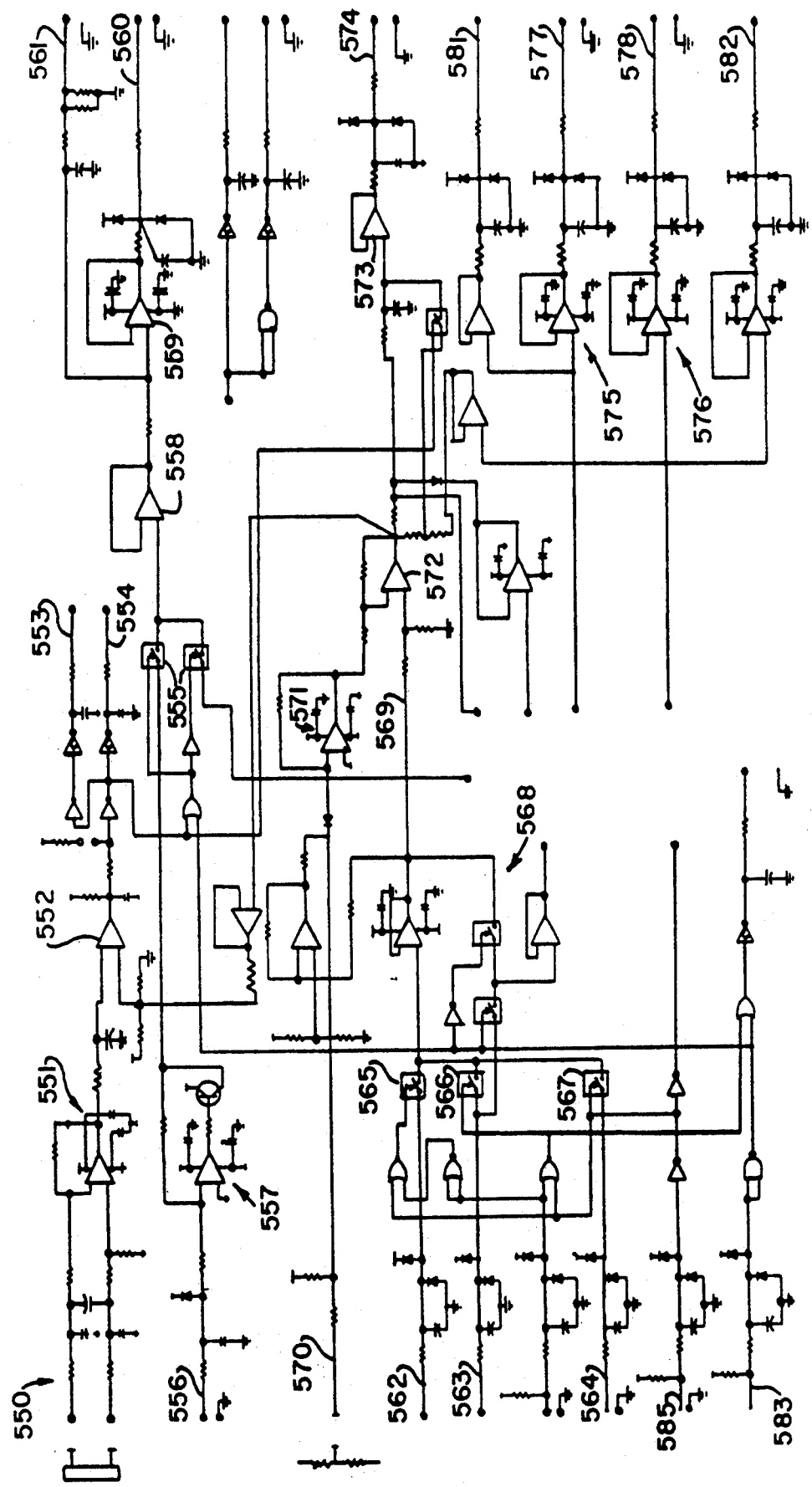
FIGS. 13 and 13A provide the circuit diagram for the analog means as previously shown in FIG. 4.
Figure 13A:
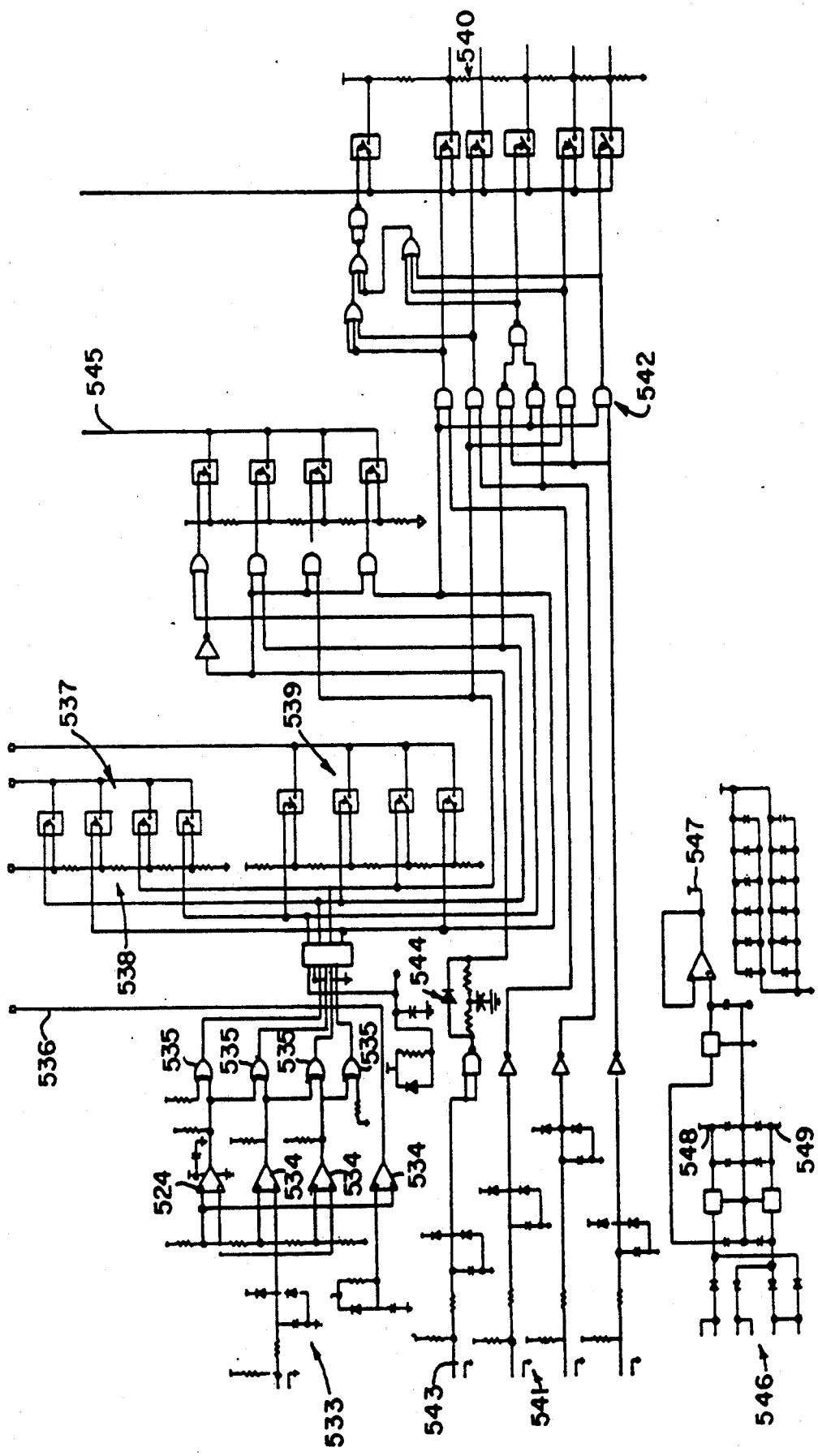

FIGS. 13 and 13a provide the circuit diagram for the analog means 216, as previously reviewed and explained in FIG. 4. More specifically, the circuitry 533 provides a means for detecting of the number of power modules that have been stacked into the apparatus. For example, the comparators 534 act in conjunction with the gates 535 to furnish a reading as to the number of power modules stacked into the unit, and as can be seen, up to four modules may be detected, in any assembly. In the event that five or more of the power modules are detected within the assembly, then the bottom comparator 534 conducts a charge over the circuit line 536 to indicate that an excessive number of modules has been applied, and that the unit cannot be operated. The analog switches 537 provide for the selection of the various voltages available from the voltage divider 538, for determining the scaling of the preview current indication that is subsequently displayed within the display registers 513 through 515, as explained. The analog switches 539 provide for a detection of the maximum voltage range at which the device can function, as previously established by the driver 525, as previously explained. The analog switches 539 actually establish that upper voltage level at which the device can operate. And this is done depending upon the number of power modules stacked into the system, as explained. In addition, the maximum current that can be encountered by the system, in its operations, is detected by the analog switches 540, and the maximum current that may be applied to the system, once again, is determined by the number of units stacked. In addition, the torch identification further establishes what may be the upper operating amperage level for the device. These analog switches, as at 540, provide means for detecting the amperage set and encountered. The power module stacking is established and detected by the circuitry 533, and the torch identification is established by the circuitry 541, with the signal being conducted through said circuitry 541, and the signals from both of the power module stack, and the torch id., are then processed by the gates 542, for summation by the analog switches 540.

One additional feature is provided through this circuitry, and that is in the event a drag cutting by means of a torch is encountered, which is when the torch is actually touching the metal it is cutting, the circuit line at 543 receives its signal from the logic means 208, that such an activity is taking place, and that signal is processed by the time delay means 544, and conducted through the circuit line 545, in order to set the maximum current that will be allowed to be encountered by the apparatus during a drag cutting function. Obviously, a drag cutting function can be deleterious to the torch, and the system, and therefore, needs to be detected, when occurring, so that its presence can be regulated and limited to safe levels of operation. The circuitry 546 provides the power supply for the analog board 216, with the input voltage being at approximately 36 volt center tap, while the output voltage, as along the circuit line 547, being a +10 volts, the outputs along the circuit lines 548 being a +15 DC, and at circuit line 549 being a −15 volts DC. In FIG. 13, which is part of the analog circuitry, the circuitry at 550 detects the presence of the cutting current in the operations of the torch, and changes the amperage display, as through the AMPS display registers 513 through 515, from the preview setting, with its decimal display, to an actual reading of the amperage employed. The signal conducted through the circuitry 550 is amplified by the operational amplifier 551, the level of the amperage is detected by the comparator 552, with the output being conducted to the logic means, by way of the conductor 553, and also to the display, as aforesaid, by way of conductor 554. The two analog switches 555 provide for the conversion from the preview display, as aforesaid, to the actual amperage display. The conductor 556 receives a signal from the power module, and it is amplified by means of the amplifier 557, to provide for a driving of the amperage display, as the signal passes through the analog display 555, for conduct to the buffers 558 and 559, where the output from the buffer 559 is conducted over the circuit line 560, to a remote display. The signal conducted over the circuit line 561 is displayed upon the display registers 513 through 515. The input from the main current control 523 is conducted by way of the circuit line 562 while the input from the corner slow down control, 524, is conducted through the circuit line 563; with the current signal from any remote, if a remote control is being used, is conducted over the circuit line 564. The various signals along the circuit lines 562 through 564 are processed by the analog switches 565 through 567, respectively, buffered by the buffers 568, and conducted over the circuit line 569. Conductor 570 conducts the main voltage from the power supply, as step down, such that when the detected voltage is above a certain threshold, it is processed by the amplifier 571, and reduces the current setting to a more reasonable level, in the event that the voltage setting is just too high. When the voltage drops below that upper tolerable level, the voltage along the circuit line 569 is conducted through the difference amplifier, or operational amplifier 572, and conducted to the buffer 573, to signal a control of the output current of the power supply, as along circuit 574. The minimum and maximum current levels for the operations of both the regular set amperage, for operations of the torch, as established by the potentiometer 523, and the lower set amperage, as established by the potentiometer 524, are buffered by the drivers 575 and 576, respectively, and are outputted through the conductors 577 and 578, respectively, to the circuit lines 579 and 580, as shown in FIG. 12. The circuit lines 581 and 582 achieve the same purpose, and conduct the signals to any remote control, or display, that may be provided within the system. The output signal from the circuit line 532, FIG. 12, which provides a ready reading of a lower amperage setting, as previously explained, is conducted through the circuit line 583, FIG. 13, processed, and is delivered to the display registers 513, through 515, over the circuit line 584, for providing that three decimal display, as previously explained. The circuit line 585 simply provides an indication as to when any remote display may be employed in the operations of the device.

Figure 14A:
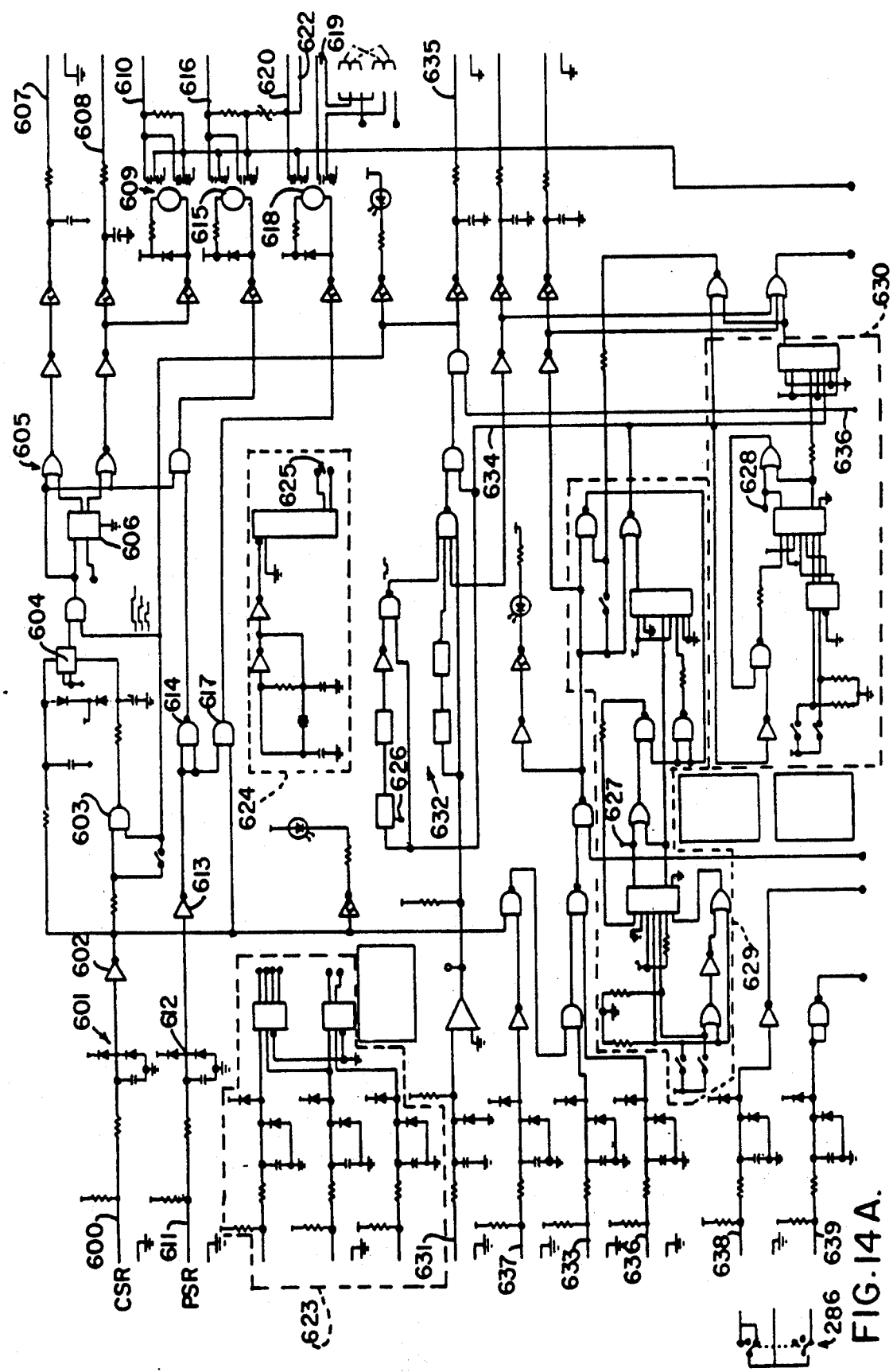

FIGS. 14A and 14B disclose the circuit diagram for the logic means 208 of this invention. This was previously shown and briefly described with respect to the description of the FIG. 4 schematic. More particularly, the signal from the analog board, as through its conductor 553, is conducted through the circuit line 600, its signal is processed by means of a filter 601, the invertor 602, passes the gate 603, is further processed by the flip-flop 604, gated by the circuitry 605, after being subjected to a time delay on the turn-off, as at 606, such that the signal over the circuit line 607 goes to the pilot to shut it off, after the torch cutting is initiated, while the signal over the circuit line 608 turns on the pilot status LED, as at 508, as previously explained in FIG. 12, to indicate that the pilot is on or off. The signal is further processed by the relay 609, and its output signal over the conductor 610 turns on the pilot contactor 204. Its signal received over the circuit line 611 is conducted from the pilot regulator 206, is further processed by the filter 612, the inverter 613, is gated at 614, and processed to the relay 615, where its output signal over the conductor 616 turns the high frequency generator 192, of FIG. 4, on or off. The two previously processed signals get processed by the AND gate 617, conduct through the relay 618, and supply a signal to the cutting machine to initiate its patterned movement, as when commencing a cutting function by the torch. This signal is conducted over the circuit lines collectively shown at 619. The signal over the circuit line 620 is conducted to initiate the functioning of a water shield, the high flow water shield. The charge over the circuit line 622 is conducted to the optional stand-off control, that tells the apparatus to start regulating the stand-off. This is the established height of the torch above the work during a cutting operation. The circuitry contained within the block 623 provides the torch identification means, which as previously explained, identifies which particular type of torch is being employed and used by the apparatus. The circuitry as contained within the block 624 comprises the system clock, which provides timing signals for operations of the logic board. The out-puts from the clock, as at points 625, are supplied to the input 626, 627, and 628. The circuitry within the block 629 is a preflow timer, which provides a timed amount of gas flow, from or to the torch, before the pilot or the main cutting arc can be established, and to ensure that the adequate and proper amount of gas is flowing, before the torch is turned on. The circuitry within the block 630 is a post flow timer, which likewise provides for an indication and reading of the amount of gas flow to the unit, at the end of a cut, and before the unit is shut off. The purpose of this is to help cool the torch, after a cut, and before it is shut off. The charge on the circuit line 631 provides an indication of what voltage is being outputted from the power supply, and the circuit as at 632, comprising a series of time delays, for providing an indication that the voltage from the power supply is present, and adequate, otherwise it provides an indication that something is wrong with the power supply. The charge conducted over the circuit line 633 provides a signal received from the torch, for the purpose of turning on the power supply, and to establish the pilot and cutting arcs, in preparation for a cutting function. That signal initiates the function of the preflow timer 629, which in turn conducts an enabling signal, by way of circuit line 634, to the power supplies, to turn them on. This signal is conducted out of the circuit line 635. In addition, the signal over the conductor 636 achieves the same purpose, but from any remote unit that may be used in conjunction with the set up of the device. The signal conducted over the line 637 is identified as a normal/latch mode, such that when cutting arc, should one remove the cutting arc control signal, the arc would immediately quench, but in the latch mode, when you remove the cutting arc control, the arc continues, and is held on, so long as there is metal to be cut. The switch 286, as previously identified in FIG. 5, is also interconnected with the logic means, as can be seen in FIG. 14A. The input over circuit line 638 is used to instruct the logic to shut off the secondary gas, as when secondary gas is not needed. The signal over circuit line 639 instructs the coolant module, of FIG. 5, to turn on the secondary water valve 256, in order to supply such water to the torch secondary gas to maintain or to enchance the quality of the torch cut.

The run switch as shown in FIG. 7, when initiated, provides for three settings. This switch is shown at 640, in FIG. 14B. When set in the upper direction, as noted, it conducts a signal through the circuit line 641, to instruct the apparatus to run. When set at the center tab, it is in the purge mode, which causes the plasma gas only to flow, to purge the system. When it is in the lower setting, it conducts a signal over circuit line 642, to place the system in the "set" mode, to conduct both plasma and the secondary gases, through the system, to provide for setting of the gas regulators. The signals conducted over the circuit lines 641 and 642 are processed by the various gates, as shown at 643, to initiate the relays 644 and 645, for outputting their signals over the signal lines 646 and 647 to achieve their aforesaid purposes. Circuit line 648 provides for a purge cycle to be initiated by signal from any remote unit, if employed. The pressure switch 649 is subject to the gas control unit 212, of FIG. 4. When initiated, they send their signals over the circuit lines 650 and 651, with the signal over the line 650 providing for an indication of adequate gas pressure, while the signal over circuit line 651 provides for an indication of adequate secondary gas, within the system. Once again, their signals are processed by a series of gates, as at 652, and come together at the connecting point 653, where their signal is transmitted over the circuit line 654 to turn on the gas LED 506, as previously explained. The signal is also conducted over the circuit line 655, to the circuit line 656, for removing the power supply enabling signal at 635, in the event that that the gas pressure is insufficient. The switch 657 is an emergency stop switch from a remote control unit, if employed, and which is designed to shut off the power supply, and the coolant, in the event that a malfunction occurs. The circuit line 658 provides an indicator that a remote control unit is employed. Temperature sensor 659 provide indication from the pilot regulator 206, and the power modules, 24, to indicate when temperature aberrations occur, and transmit signals over the circuit lines 660 and 661 to provide for a shut-off, of the power supplies, under such conditions. Circuit line 662 provides a signal from the coolant module 56, to indicate that the coolant flow is adequate. The signal conducted over the circuit line 663 is conducted from the torch head, of the cutting torch, so as to indicate when its components are properly installed, and the torch can operate adequately. It is to be noted that the signals from switch 657, on down to the circuit line 663, are gaited by the gate means 664, and conducted up to the gate 665, so that if any one of the signals detect an aberration, of any one of the types as previously explained, the signal will not be allowed to pass the NOR gate 665, which in effect causes a shut-off of the entire apparatus. Circuit line 666 senses a drag cut function, of the type as previously explained, meaning that careful detection must be made of such a cutting function, so that its signal is processed by the comparator 667, and sent to the analog means 216, by way of circuit line 668, and passes by way of circuit line 543 therein, for processing in the manner as previously explained. The circuitry as shown at 669 is the power supply for this logic means 208. Thirty-six volts center tap is conducted through the circuit lines 670, and is outputted as a +18 volts DC, as at circuit point 671, and is outputted as a +15 volts at circuit point 672. The output from point 671 goes to the relays 644 and 645, in addition to the relays 673 and 674. In addition, the signal is conducted to the relay 609, 615, and 618, as previously identified. The output from the circuit point 672 is conducted to all other aspects of the logic means 208. The relay 673, when it processes its signal, sends the signal by way of its circuit line 675, which monitors the water cool torch, and initiates operations of the coolant module 56, when necessary. The relay 674 conducts its signal over circuit line 676, in order to initiate the operations of the various solenoids, and the contactor 204, as previously explained. The signals conducted over the circuit lines 677 and 678 are the output current of the pilot regulator, 206, and this particular setting is determined by the torch id. and size utilized in the cutting operation.

FIG. 15 discloses high frequency generator 192 of this invention, and its detailed circuitry. It is a conventional spark gap type of generator, for generating frequency, but also generates a high voltage, in the rage of 10,000 volts, at an approximate mega hertz range. It includes its transformer 679, for generating these extrordinarily high voltages and high frequency.

Figure 16:
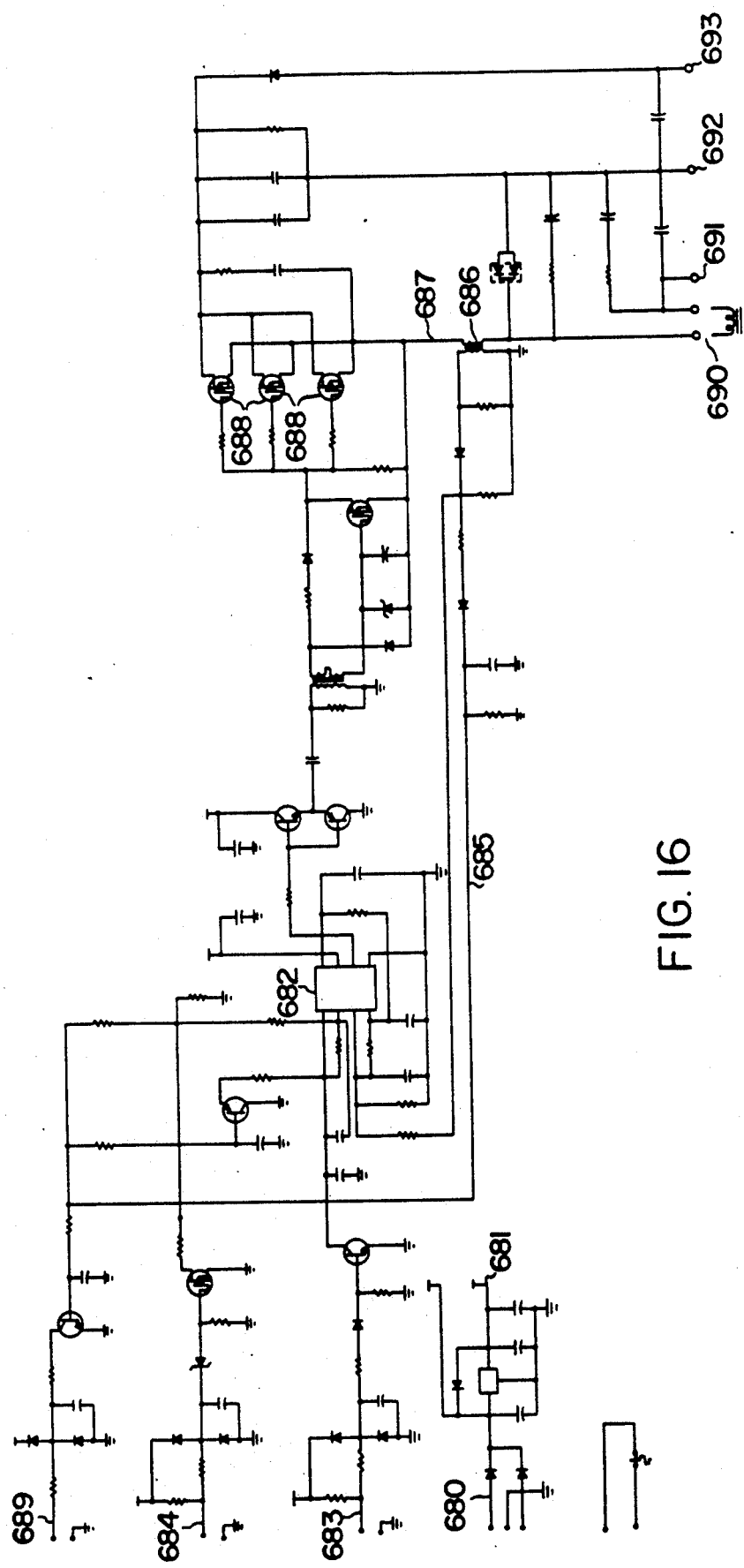
FIG. 16 shows the detailed circuitry for the pilot regulator as previously explained in FIG. 4.

The pilot regulator, and more specifically its detailed circuitry, is shown in FIG. 16. The pilot regulator was previously described, in its schematic relationship, in FIG. 4, as component 206. The function of this pilot regulator is, as known in the art, to initiate an arc between the torch and the workpiece, without contact. The detailed circuit diagram from the pilot regulator is shown herein, and comprises a pulse width type of regulator which replaces the type of resistor fabricator pilot, as previously used in the art. As a result, by applying or incorporating a pulse width modulator herein, it results in less power dissipation, during functioning of the cutting torch. As can be seen, a low voltage power supply 680 is provided, having an input voltage of approximately 36 volts AC center tap, and output voltages of approximately regulated 18 volts DC. This is output along the conductor 681. This voltage is conducted to the pulse width modulator chip 682, wherein the modulator 682 receives an on-off signal by way of the circuit line 683. The signal over line 684 provides for an indication of the demand for the amount of pilot current required in order to pilot the torch, and the modulator 682 compares that particular demand signal with the feedback signal over circuit line 685, received from the pulse transformer 686, wherein the pilot current conducted over the circuit line 687 provides an indication of the actual current being used by the pilot, during its functioning. The modulator then compares these currents, regulates the pulse width of the power fets 688, which switches the power on and off, for the pilot current. The conductor 689 sends a signal from the pilot regulator, to provide an indication that a pilot current has been sensed, and is flowing, and that the pilot is functioning properly. A smoothing inductor 690 receives the signal wave from the fets and smoothes out that wave form, in order to provide a DC form of wave output at the terminals 691 and 692, forming the necessary arc during proper functioning and operations of the pilot means. The power input terminal 693 is the main current that is inputted to the pilot, to attain its regulation by the fets, and that particular power comes from the main DC outputs along conductor 74A and 74B.

In view of the foregoing, it will be seen that the several objects of the invention are achieved and other advantageous results are obtained.

As various changes could be made in the above constructions without departing from the scope of the invention, it is intended that all matter contained in the above description, or shown in the accompanying drawings, shall be interpreted as illustrative and not in a limiting sense.

Having thus described the invention, what is claimed and desired to be secured by Letters Patent is:

1. Plasma cutting apparatus for use in cutting a material comprising:
   a cutting torch for cutting the material, control means for controlling a cutting operation performed using the torch, said control means including a control module in which the control means is housed, at least one power means for supplying power to the cutting torch, the application of said power being controlled by said control means, and said power means including at least one power module in which said power means is housed, the control module and power module being removably stackable one on top of the other, an electrical connection means carried on each control and power module for automatically electrically connecting at least said one power module to the control module at the interface between the stacking of the control module onto the said at least one power module.

2. The apparatus of claim 1 and further including a plurality of said power means, each power means being housed in a separate power module, and said power modules being removably stackable one on top of the other, an electrical connection means carried on each said control and power module for automatically electrically connecting said control and power modules together at the interface of their stacking one on top of the other when stacked together for usage.

3. The apparatus of claim 1 further including cooling means for cooling the torch, said cooling means including a cooling module removably stackable with the control module and power module, and said cooling module being electrically connected at the interface of its stackability with the adjacent power module.

4. The apparatus of claim 2 wherein the connection means comprises a set of electrical connectors positioned at an upper side of a module and a set of mating electrical connectors positioned at the base of the module which is stacked on top of the first said module, the respective sets of connectors being in registry with each other so when the one module is stacked on top of the other, the electrical connectors within the respective sets interfit and form an electrical connection at the interface between the two modules.

5. The apparatus of claim 4 wherein the electrical connectors comprising the first said set male connectors, and the electrical connectors comprising the second said set are female connectors.

6. The apparatus of claim 3 and further including means for attaching adjacent stacked power modules together whereby the modules cannot be dislodged from each other.

7. The apparatus of claim 6 wherein the attaching means includes a hinge formed on adjacent surfaces of the modules when they are stacked each said hinge comprising interfitting hinge segments formed on the respective surfaces of the modules, the segments interfitting when the modules are stacked, and a hinge pin insertable through the interfitted hinge segments to lock adjacent modules together.

8. The apparatus of claim 6 further including means forming a base for the modular stack.

9. The apparatus of claim 8 wherein the base means comprises a base plate which fits beneath the bottom module in a stack thereof, the plate including means for attaching it to the bottom most module in the stack.

10. The apparatus of claim 8 and further including handle means removably attachable to at least one of the stacked modules for lifting the stack and transporting it from one place to another.

11. The apparatus of claim 1 which is connectable to either a single-phase or a multi-phase power source.

12. The apparatus of claim 11 wherein the power means includes AC-DC conversion means.

13. The apparatus of claim 1 wherein the control means includes means for sensing the operational condition of the apparatus.

14. The apparatus of claim 13 wherein the control means further includes logic means responsive to the sensing means for controlling operation of the apparatus, the logic means responding to inputs from the sensing means to produce control signals provided to the torch, lower means and cooling means.

15. The apparatus of claim 14 wherein the control means further includes display means for providing a visual indication of the current operating status of the apparatus.

16. The apparatus of claim 15 wherein the control means further includes analog means for providing inputs to the display means, the analog means converting display inputs from the logic means to provide indications which can be displayed by the display means.

17. The apparatus of claim 14 wherein the torch has a pilot, and the control means includes means for operating the pilot to ignite the torch.

18. The apparatus of claim 3 wherein the cooling means includes means for providing a primary and a secondary coolant for the torch.

19. The apparatus of claim 18 wherein the secondary coolant is either a gas or a liquid, and the cooling means includes coolant control means for controlling flow of the primary coolant and the secondary coolant.

20. An apparatus for use for one of plasma cutting and welding of a material, comprising:
at least one of a cutting torch and welding means for processing the subject material;
control means for controlling the operation performed by the apparatus, said control means including a control module in which the control means is housed;
at least one power means for supplying power to the control means, the application of said power being controlled by said control means, and said power means including at least one power module in which said power means is housed, the control module and power module being removably stackable one on top of the other, an interconnecting means between the control module and power module at the contiguous interface between said modules to conduct processed electrical charge between said modules during usage of the apparatus.

21. The invention of claim 20 and wherein said control module includes logic means for processing of select signals from various aspects of the apparatus for providing detection and regulation in the functioning of the apparatus, analog means electrically connected to the logic means and operating in conjunction with the information detected by the logic means for selecting the proper voltage levels during operation of the apparatus, and display means, electrically connected to the analog means, and provided for processing signals for visually displaying select data relating to the operations of said apparatus.

22. The invention of claim 21 and wherein circuit means electrically connected within the logic means, said circuit means provided for furnishing an identification of the particular type of plasma cutting means connected with the control means of the apparatus and to initiate the selection of the proper amperage and voltage levels for use in conjunction with the cutting means.

23. The invention of claim 22 and including circuitry included within the analog means, and for processing electrical signals for varying the amperage and input voltage from the power module when a drag cutting function is encountered by the plasma cutting means.

24. The invention of claim 20 and wherein said power means of the power module incorporating transformer circuitry for providing voltage select for delivery to the control means for providing electrical operations to the apparatus, said power means providing for rectification of the charge converted to DC power, a pair of capacitor banks contained within the power means, to process the rectified charge, and cross coupled windings provided within the circuitry for controlling the application of the various rectified wave forms to the primary windings of the power transformers in order to attain mid-point capacitor balancing of the processed charge.

25. The invention of claim 21 and including a pilot regulator contained within the control means and electrically connected with the logic means, for determining when the pilot of the plasma cutting means is operative, or cut off, during a cutting operation.

* * * * *

UNITED STATES PATENT AND TRADEMARK OFFICE
CERTIFICATE OF CORRECTION

PATENT NO. : 5,189,277
DATED : Feb. 23, 1993
INVENTOR(S) : John A. Boisvert, et al.

It is certified that error appears in the above-identified patent and that said Letters Patent is hereby corrected as shown below:

Claim 14, column 21, line 55, change "lower" to ---power---.

Claim 22, column 22, line 46, after "the" and before "cutting", insert ---selected---.

Claim 24, column 22, line 53, after "incorporating" and before "transformer", insert ---power---; line 54, change "select" to ---selection---.

Signed and Sealed this

Thirtieth Day of November, 1993

Attest:

BRUCE LEHMAN

*Attesting Officer*   *Commissioner of Patents and Trademarks*